United States Patent
Chang et al.

(10) Patent No.: US 9,048,456 B2
(45) Date of Patent: Jun. 2, 2015

(54) ORGANIC LIGHT-EMITTING DIODE

(75) Inventors: Seung-Wook Chang, Yongin (KR);
Young-Hee Lee, Yongin (KR);
Mu-Hyun Kim, Yongin (KR);
Hyo-Yeon Kim, Yongin (KR);
Sang-Woo Pyo, Yongin (KR);
Seung-Mook Lee, Yongin (KR);
Byeong-Wook Yoo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 676 days.

(21) Appl. No.: 13/365,204

(22) Filed: Feb. 2, 2012

(65) Prior Publication Data

US 2013/0001528 A1  Jan. 3, 2013

(30) Foreign Application Priority Data

Jun. 30, 2011  (KR) .......................... 10-2011-0065140

(51) Int. Cl.
| | |
|---|---|
| H01L 51/50 | (2006.01) |
| H01L 51/52 | (2006.01) |
| H01L 51/00 | (2006.01) |
| H01L 27/32 | (2006.01) |

(52) U.S. Cl.
CPC ........ *H01L 51/5265* (2013.01); *H01L 51/0051* (2013.01); *H01L 51/5064* (2013.01); *H01L 27/3211* (2013.01)

(58) Field of Classification Search
None
See application file for complete search history.

(56) References Cited

U.S. PATENT DOCUMENTS

| | | | |
|---|---|---|---|
| 2006/0136864 A1 | 6/2006 | Choi et al. | |
| 2007/0046185 A1 | 3/2007 | Kim | |
| 2008/0174236 A1* | 7/2008 | Kinoshita et al. | 313/504 |
| 2010/0051973 A1* | 3/2010 | Kobayashi et al. | 257/88 |

FOREIGN PATENT DOCUMENTS

| | | |
|---|---|---|
| KR | 10-2004-0104225 A | 12/2004 |
| KR | 10-2006-0070609 | 6/2006 |
| KR | 10-2007-0024286 | 3/2007 |
| KR | 10-2007-0081965 A | 8/2007 |

* cited by examiner

*Primary Examiner* — Gregory Clark
(74) *Attorney, Agent, or Firm* — Christie, Parker & Hale, LLP

(57) ABSTRACT

An organic light-emitting diode (OLED) having first, second and third sub-pixels of different colors includes: a substrate; first and second electrodes; an organic emission layer (OEL) between the electrodes including a first OEL in the first sub-pixel, a second OEL in the second sub-pixel, and a common third OEL in the first, second and third sub-pixels; a hole transport layer (HTL) between the first electrode and OEL; a hole injection layer (HIL) between the first electrode and HTL; an intermediate layer between the HTL and HIL; a first optical thickness auxiliary layer (OTAL) between the first OEL and third OEL in the first sub-pixel and including a first hole transporting compound and a cyano group-containing compound; and a second OTAL including a second hole transporting compound between the third OEL and HTL in the first sub-pixel, and between the second OEL and HTL in the second sub-pixel.

19 Claims, 3 Drawing Sheets

ORGANIC LIGHT-EMITTING DIODE

CROSS-REFERENCE TO RELATED PATENT APPLICATION

This application claims priority to and the benefit of Korean Patent Application No. 10-2011-0065140, filed on Jun. 30, 2011 in the Korean Intellectual Property Office, the entire content of which is incorporated herein by reference.

BACKGROUND OF THE INVENTION

1. Field of the Invention

The present invention relates to an organic light-emitting diode.

2. Description of Related Art

Organic light-emitting diodes (OLEDs) are self-emitting devices that have advantages such as a wide viewing angle, good contrast, quick response times, high brightness, and good driving voltage characteristics. OLEDs can provide multicolored images.

In general, an OLED has a structure including a substrate, and an anode, a hole transport layer (HTL), an emission layer (EML), an electron transport layer (ETL), and a cathode are sequentially stacked on the substrate. In this regard, the HTL, the EML, and the ETL are organic layers formed of organic compounds.

An operating principle of an OLED is as follows: when a voltage is applied between the anode and the cathode, holes injected from the anode move to the EML via the HTL, and electrons injected from the cathode move to the EML via the ETL. The holes and electrons recombine in the EML to generate excitons. When the excitons drop from the excited state to the ground state, light is emitted.

According to conventional OLED manufacturing processes, a patterning process needs to be performed on each of a plurality of pixel units, thus requiring a patterning process to be performed by at least three deposition or transferring processes. In addition, micro-patterns need to be formed in each pixel unit, and thus misalignment of the micro-patterns may occur. Furthermore, since holes move faster than electrons in each pixel unit, a process of forming a hole blocking layer on an emission layer to prevent the movement of holes may be further performed. To address these problems, a structure in which a blue emission layer is formed as a common layer in an upper portion or lower portion of the emission layer has been introduced.

FIG. 1 is a schematic cross-sectional view of a conventional organic light-emitting diode (OLED) 100. A first organic emission layer 131 emits red visible rays, a second organic emission layer 132 emits green visible rays, and a third organic emission layer 133 emits blue visible rays.

The third organic emission layer 133 is stacked on a hole transport layer (HTL) 122 over a first sub-pixel SP1, a second sub-pixel SP2, and a third sub-pixel SP3. The first organic emission layer 131 is formed on the third organic emission layer 133 in the first sub-pixel SP1, and the second organic emission layer 132 is formed on the third organic emission layer 133 in the second sub-pixel SP2.

Alternatively, the third organic emission layer 133 is stacked as a common layer on the HTL 122 over the first sub-pixel SP1, the second sub-pixel SP2, and the third sub-pixel SP3. A second optical thickness auxiliary layer (not shown) is formed on the third organic emission layer 133 over the first sub-pixel SP1 and the second sub-pixel SP2. A first optical thickness auxiliary layer (not shown) is formed on the second optical thickness auxiliary layer in the first sub-pixel SP1. The second organic emission layer 132 is formed in the second sub-pixel SP2, and the first organic emission layer 131 is formed on the first optical thickness auxiliary layer (not shown) in the first sub-pixel SP1. When an OLED having such a structure (in which the blue emission layer is disposed as a common layer in a lower portion of the emission layer) is manufactured, the number of patterning processes decreases due to the formation of the blue emission layer as a common layer. However, the characteristics of the OLED, in particular, the green diode are degraded, and thus, the lifetime of the green diode is shortened.

SUMMARY OF THE INVENTION

Embodiments of the present invention provide an organic light-emitting diode with low driving voltage, high image quality and long lifetime by controlling the organic emission layer and an optical thickness auxiliary layer.

According to an aspect of the present invention, an organic light-emitting diode includes a first sub-pixel, a second sub-pixel and a third sub-pixel of different colors, the organic light-emitting diode including: a substrate; a first electrode formed on the substrate; a second electrode formed on the first electrode and facing the first electrode; an organic emission layer between the first electrode and the second electrode, wherein the organic emission layer includes a first organic emission layer formed in the first sub-pixel, a second organic emission layer formed in the second sub-pixel, and a third organic emission layer formed as a common layer in the first, second and third sub-pixels; a hole transport layer between the first electrode and the organic emission layer; a hole injection layer between the first electrode and the hole transport layer; an intermediate layer between the hole transport layer and the hole injection layer; a first optical thickness auxiliary layer between the first organic emission layer and the third organic emission layer in the first sub-pixel and comprising a first hole transporting compound and a cyano group-containing compound; and a second optical thickness auxiliary layer between the third organic emission layer and the hole transport layer in the first sub-pixel, between the second organic emission layer and the hole transport layer in the second sub-pixel, and comprising a second hole transporting compound.

The third organic emission layer may emit blue visible rays.

The cyano group-containing compound may include at least one compound represented by Formulae 1 through 20 below:

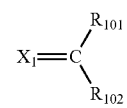

Formula 1

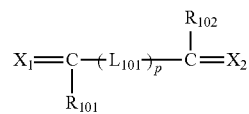

Formula 2

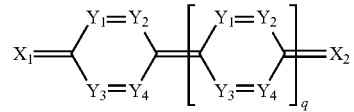

Formula 3

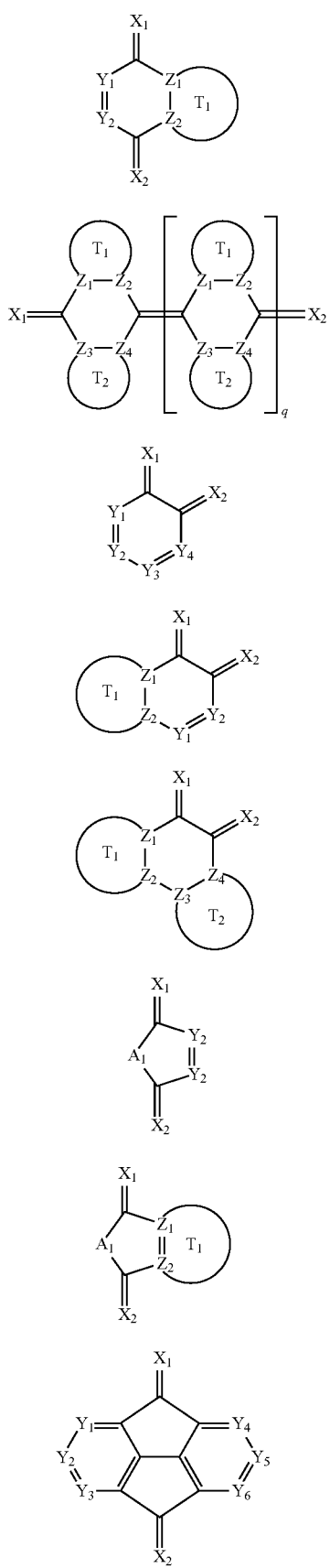
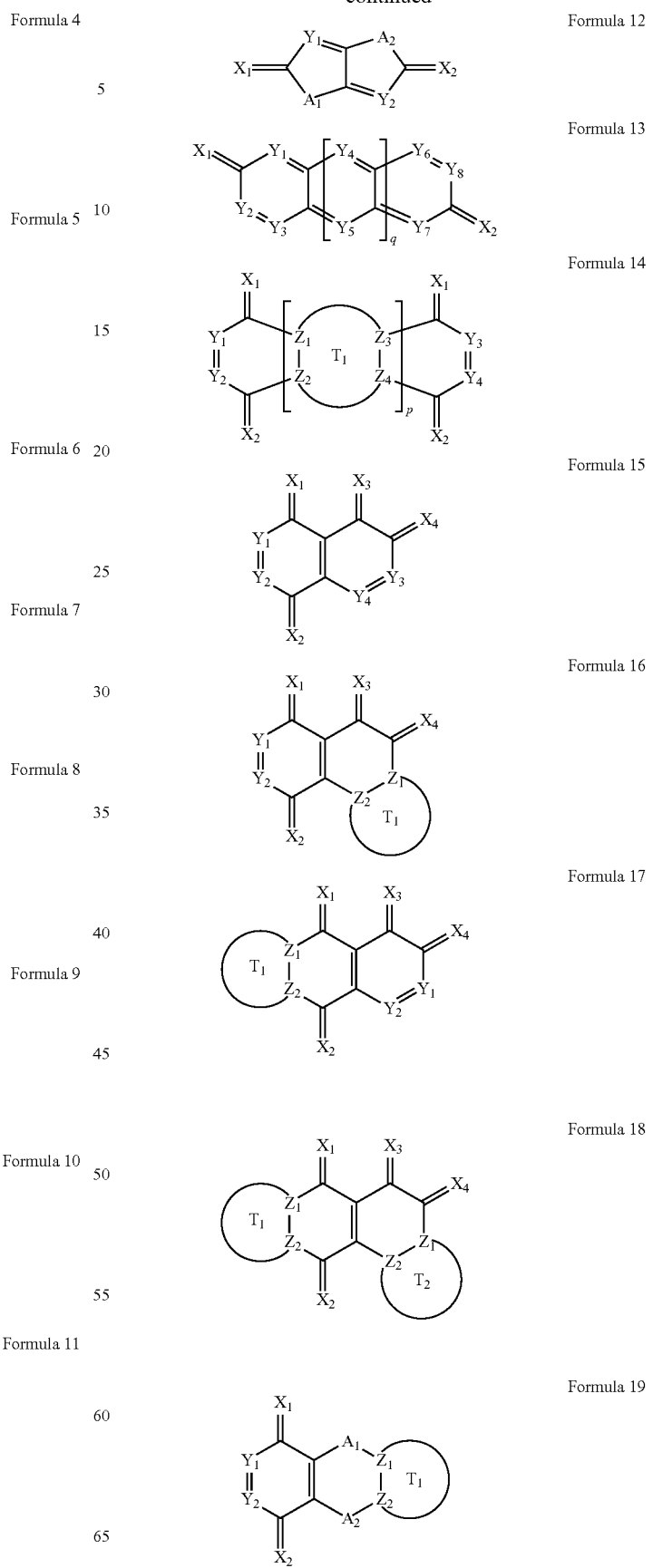

Formula 20

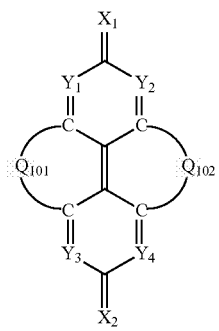

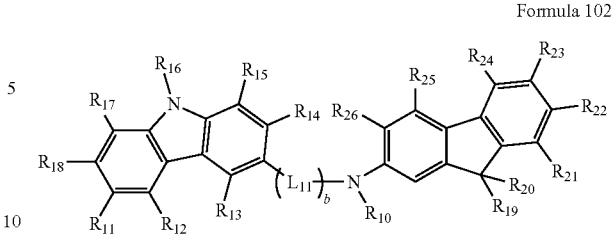

In Formulae 1 through 20, each of $X_1$, $X_2$, $X_3$, and $X_4$ is independently selected from

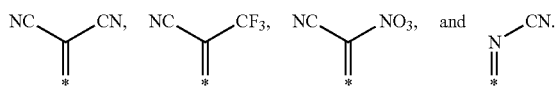

Each of $Y_1$ through $Y_8$ is independently N or $CR_{103}$. Each of $Z_1$, $Z_2$, $Z_3$, and $Z_4$ is independently CH or N. Each of $A_1$ and $A_2$ is independently one of O, S, $NR_{104}$, and $C(R_{105})(R_{106})$. $L_{101}$ is a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group. Each of $Q_{101}$ and $Q_{102}$ is independently a substituted or unsubstituted $C_1$-$C_{30}$ alkylene group or a substituted or unsubstituted $C_2$-$C_{30}$ alkenylene group. Each of $T_1$ and $T_2$ is independently a substituted or unsubstituted $C_5$-$C_{30}$ aromatic ring system or a substituted or unsubstituted $C_3$-$C_{30}$ heteroaromatic ring system. Each of $R_{101}$, $R_{102}$, $R_{103}$, $R_{104}$, $R_{105}$, and $R_{106}$ is independently selected from a hydrogen atom, a deuterium atom, a halogen atom, a hydroxyl group, a cyano group, a nitro group, a carboxyl group,

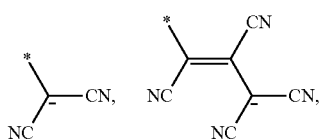 [SMILES: *[C-](C#N)C#N ; */C(C#N)=C(\C#N)[C-](C#N)C#N]

a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, and $N(R_{107})(R_{108})$. Each of $R_{107}$ and $R_{108}$ is independently selected from a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_5$-$C_{30}$ aryl group, and a substituted or unsubstituted $C_3$-$C_{30}$ heteroaryl group. Also, p is an integer of 1 to 10, and q is an integer of 0 to 10.

The first hole transporting compound may include at least one compound represented by Formulae 101 and 102:

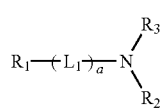

Formula 101

In Formulae 101 and 102, $R_{10}$ is $-(Ar_1)_n-Ar_2$. Also, $R_{11}$ is $-(Ar_{11})_m-Ar_{12}$. Each of $L_1$, $L_{11}$, $Ar_1$, and $Ar_{11}$ is independently selected from a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, and $-N(Q_1)-$. Each of $R_1$ through $R_3$, $R_{12}$ through $R_{26}$, $Ar_2$, $Ar_{12}$, and $Q_1$ is independently a hydrogen atom, a deuterium atom, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted, $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_3$-$C_{30}$ heteroaryl group, or a group represented by $-N(Q_2)(Q_3)$. Each of $Q_2$ and $Q_3$ is independently selected from a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, and a substituted or unsubstituted $C_3$-$C_{30}$ heteroaryl group. Each of a, b, m, and n is independently an integer of 0 to 10. Also, the $Ar_1$ groups in $-(Ar_1)_n-$ are the same as or different from each other, the $Ar_{11}$ groups in $-(Ar_{11})_m-$ are the same as or different from each other, the $L_1$ groups in $-(L_1)_a-$ are the same as or different from each other, and the $L_{11}$ groups in $-(L_{11})_b-$ are the same as or different from each other.

An amount of the cyano group-containing compound in the first optical thickness auxiliary layer may be in a range of about 0.1 to about 1.0 part by weight based on 100 parts by weight of the first optical thickness auxiliary layer.

The first optical thickness auxiliary layer may contact the first organic emission layer and the third organic emission layer.

The first optical thickness auxiliary layer may have a thickness in a range of about 100 Å to about 800 Å.

The second hole transporting compound may be the same as the first hole transporting compound.

The second optical thickness auxiliary layer may contact the hole transport layer.

The second optical thickness auxiliary layer may have a thickness in a range of about 100 Å to about 800 Å.

The third organic emission layer may have a thickness in a range of about 50 Å to about 500 Å.

The intermediate layer may include at least one selected from hexa-azatriphenylene hexacarbonitrile (HAT-CN), 7,7,8,8-tetracyanoquinonedimethane (TCNQ), tetrafluorotetracyanoquinodimethane (F4-TCNQ), $MoO_3$, $V_2O_5$, $WO_3$, $SnO_2$, ZnO, $MnO_2$, $CoO_2$, $TiO_2$, and fullerene ($C_{60}$).

The intermediate layer may have a thickness in a range of about 10 Å to about 80 Å.

According to another aspect of the present invention, a flat display device includes: a transistor including a source electrode, a drain electrode, a gate electrode, and an active layer; and the organic light-emitting diode described above, wherein one of the source electrode and the drain electrode is electrically connected to the first electrode of the organic light-emitting diode.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Exemplary embodiments of the present invention will now be described with reference to the accompanying drawings.

Figure 1:
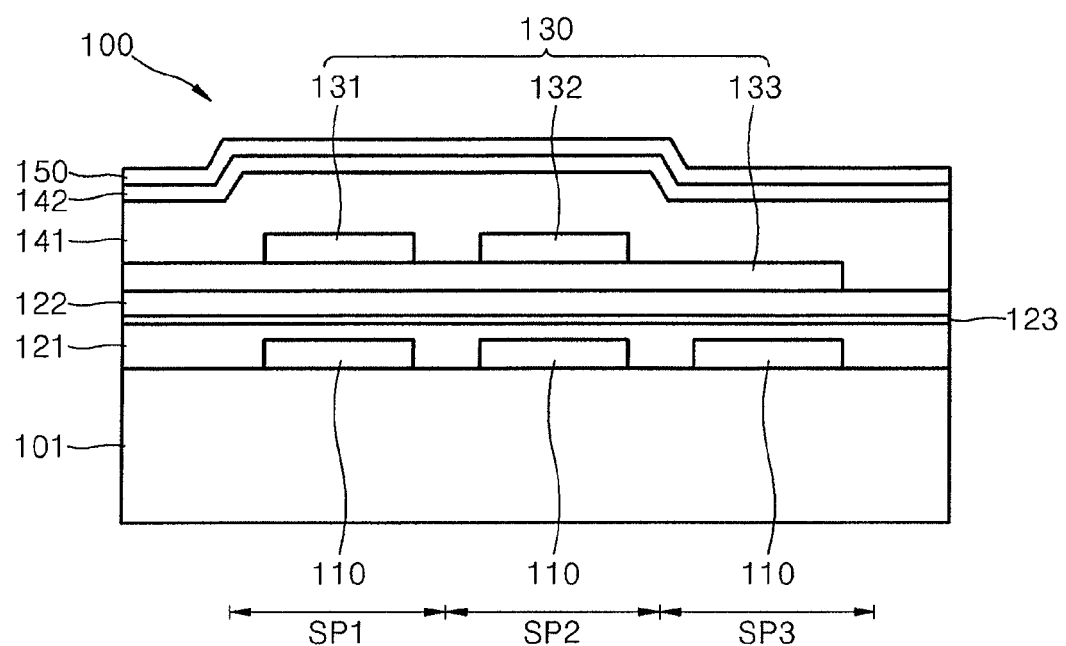
FIG. 1 is a schematic cross-sectional view of an organic light-emitting diode (OLED) according to the prior art.
Figure 2:
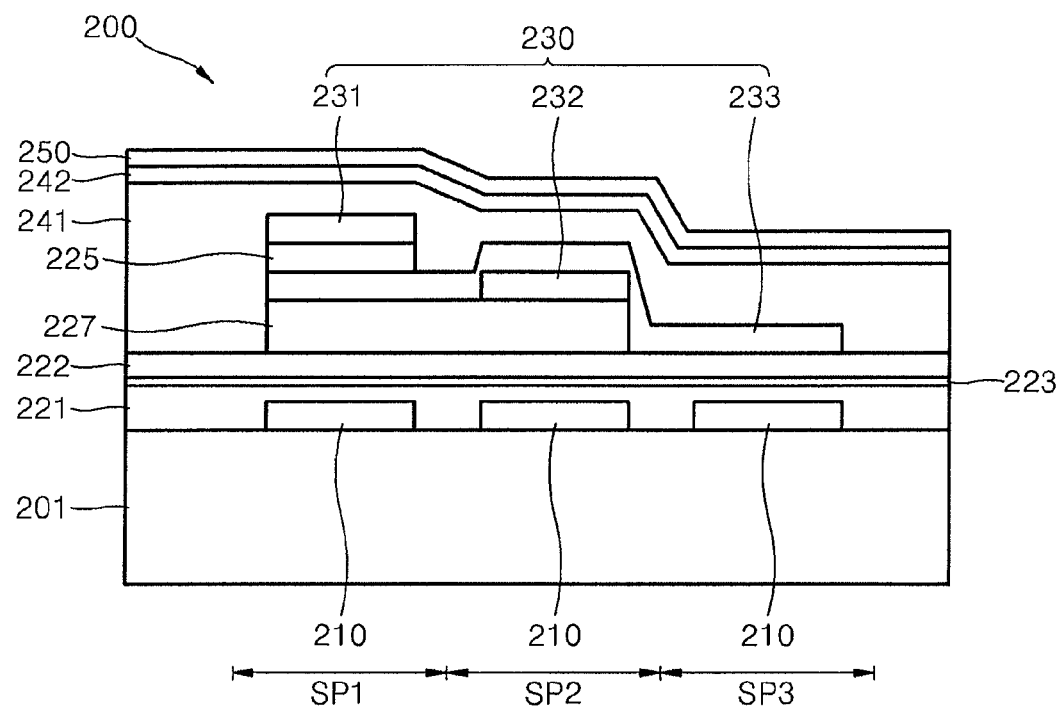
FIG. 2 is a schematic cross-sectional view of an OLED according to an embodiment of the present invention.

FIG. 2 is a schematic cross-sectional view of an organic light-emitting diode (OLED) 200 according to an embodiment of the present invention.

Referring to FIG. 2, the OLED 200 includes a first sub-pixel SP1, a second sub-pixel SP2, and a third sub-pixel SP3. The first, second and third sub-pixels SP1, SP2 and SP3 may be sub-pixels of different colors. For example, the first sub-pixel SP1 may be a red sub-pixel, the second sub-pixel SP2 may be a green sub-pixel, and the third sub-pixel SP3 may be a blue sub-pixel.

Although a single first sub-pixel SP1, a single second sub-pixel SP2, and a single third sub-pixel SP3 are illustrated in FIG. 2 for convenience of understanding, the OLED 200 may include a plurality of first sub-pixels SP1, a plurality of second sub-pixels SP2, and a plurality of third sub-pixels SP3.

The first sub-pixel SP1 includes a substrate 201, and a first electrode 210. A hole injection layer (HIL) 221, an intermediate layer 223, a hole transport layer (HTL) 222, a second optical thickness auxiliary layer 227, a third organic emission layer 233, a first optical thickness auxiliary layer 225, a first organic emission layer 231, an electron transport layer (ETL) 241, an electron injection layer (EIL) 242, and a second electrode 250 are sequentially formed on the substrate 201. The second sub-pixel SP2 includes the substrate 201, and the first electrode 210. The HIL 221, the intermediate layer 223, the HTL 222, the second optical thickness auxiliary layer 227, a second organic emission layer 232, the third organic emission layer 233, the ETL 241, the EIL 242, and the second electrode 250 are sequentially formed on the substrate 201. The third sub-pixel SP3 includes the substrate 201, and the first electrode 210. The HIL 221, the intermediate layer 223, the HTL 222, the third organic emission layer 233, the ETL 241, the EIL 242, and the second electrode 250 are sequentially formed on the substrate 201.

The constitution of each element of the OLED 200 will now be described in more detail.

First, the substrate 201 may be formed of a transparent glass composed mainly of $SiO_2$. However, the substrate 201 is not limited to this example, and may be formed of, for example, a transparent plastic. Examples of the transparent plastic include insulating organic materials such as polyethersulphone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulose triacetate (TAC), and cellulose acetate propionate (CAP).

In addition, the substrate 201 may be a metal substrate. In this case, the substrate 201 may be formed of carbon, iron, chrome, manganese, nickel, titanium, molybdenum, stainless steel (SUS), an Invar alloy, an Inconel alloy, a Kovar alloy, or a combination thereof; however, the present invention is not limited thereto. For example, the substrate 201 may be formed of a metal foil.

A passivation layer (not shown) may be formed on the substrate 201 to impart a smooth surface and prevent impurities from permeating into an upper portion of the substrate 201. The passivation layer may be formed of at least one of $SiO_2$ and $SiN_x$.

The first electrodes 210 are formed on the substrate 201. The first electrode 210 may be formed in a pattern by photolithography. The first electrode 210 may be a reflective electrode or a transparent electrode. To form a reflective electrode, the first electrode 210 may be formed by forming a reflective film by using silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, and then disposing ITO, IZO, ZnO or $In_2O_3$ having a high work function on the reflective film. To form a transparent electrode, the first electrode 210 may be formed of ITO, IZO, ZnO or $In_2O_3$ having a high work function.

In the present embodiment, the first electrode 210 may be an anode and the second electrode 250 may be a cathode, or vice versa.

The HIL 221 and the HTL 222 are formed on the first electrodes 210; however, the present invention is not limited thereto. For example, the HTL 222 may be formed on the first electrode 210 but not the HIL 221, or a plurality of HTLs 222 may be formed on the first electrode 210.

A material for forming the HIL 221 may be any known hole injection material. Examples of the hole injection material include, but are not limited to, a phthalocyanine compound such as copper phthalocyanine (CuPc), m-MTDATA, TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (PANI/CSA), and polyaniline/poly(4-styrenesulfonate) (PANI/PSS).

The thickness of the HIL 221 may be in the range of about 100 Å to about 10,000 Å, for example, in the range of about 100 Å to about 1,000 Å. When the thickness of the HIL 221 is within these ranges, satisfactory hole injection properties may be obtained without a substantial increase in driving voltage.

A material for forming the HTL 222 may be any known hole transporting material. Examples of the hole transporting material include, but are not limited to, carbazole derivatives such as N-phenylcarbazole, polyvinylcarbazole, and the like, and amine derivatives having aromatic condensed rings such as N,N'-bis(3-methylphenyl)-N,N'-diphenyl-[1,1-biphenyl]-4,4'-diamine (TPD), N,N"-di(naphthalene-1-yl)-N,N'-diphenyl benzidine (NPB), and the like. In addition, a first hole transporting compound, which will be described later, may be used in the HTL 222.

The HTL 222 may have a thickness in the range of about 50 Å to about 1,200 Å, for example, in the range of about 300 Å to about 1,000 Å. When the thickness of the HTL 222 is within these ranges, satisfactory hole transporting properties may be obtained without a substantial increase in driving voltage.

The intermediate layer 223 is disposed between the HIL 221 and the HTL 222. The intermediate layer 223 may include at least one selected from hexa-azatriphenylene hexacarbonitrile (HAT-CN), 7,7,8,8-tetracyanoquinonedimethane (TCNQ), tetrafluorotetracyanoquinodimethane (F4-TCNQ), $MoO_3$, $V_2O_5$, $WO_3$, $SnO_2$, ZnO, $MnO_2$, $CoO_2$, $TiO_2$, and fullerene ($C_{60}$). For example, the intermediate layer 223 may be formed of HAT-CN.

HAT-CN, TCNQ, F4-TCNQ, $MoO_3$, $V_2O_5$, $WO_3$, $SnO_2$, ZnO, $MnO_2$, $CoO_2$, $TiO_2$, and fullerene ($C_{60}$) as a material for forming the intermediate layer 223 are capable of trapping electrons and have good hole transporting ability. Thus, the intermediate layer 223 (formed between the HIL 221 and the HTL 222) easily transfers holes injected from the first electrode 210 in the direction of the organic emission layer 230.

The intermediate layer 223 may have a thickness in the range of about 10 Å to about 80 Å. When the thickness of the intermediate layer 223 is within this range, satisfactory hole transporting properties may be obtained without a substantial increase in driving voltage.

The organic emission layer 230 is formed on the HTL 222.

The organic emission layer 230 includes the first organic emission layer 231, the second organic emission layer 232, and the third organic emission layer 233, and further includes the first optical thickness auxiliary layer 225 and the second optical thickness auxiliary layer 227 to adjust the optical thickness.

The first organic emission layer 231 is disposed in the first sub-pixel SP1, the second organic emission layer 232 is disposed in the second sub-pixel SP2, and the third organic emission layer 233 is disposed as a common layer in the first sub-pixel SP1, the second sub-pixel SP2, and the third sub-pixel SP3.

The first optical thickness auxiliary layer 225 is disposed in the first sub-pixel SP1, and positioned between the first organic emission layer 231 and the third organic emission layer 233. The second optical thickness auxiliary layer 227 is disposed in the first sub-pixel SP1 and the second sub-pixel SP2. In this regard, the second optical thickness auxiliary layer 227 of the first sub-pixel SP1 is positioned between the third organic emission layer 233 and the HTL 222, and the second optical thickness auxiliary layer 227 of the second sub-pixel SP2 is positioned between the second organic emission layer 232 and the HTL 222.

In particular, the second optical thickness auxiliary layer 227 is formed on the HTL 222 over the first sub-pixel SP1 and the second sub-pixel SP2. The second optical thickness auxiliary layer 227 is not formed in the third sub-pixel SP3. The second optical thickness auxiliary layer 227 is formed to adjust the optical thicknesses of the first organic emission layer 231 and the second organic emission layer 232. The second optical thickness auxiliary layer 227 differentiates the length of the HTL 222 of the first sub-pixel SP1 and the second sub-pixel SP2 from the length of the HTL 222 of the third sub-pixel SP3, and thus an optical path length of visible rays emitted from the organic emission layer 230 is different for each sub-pixel, resulting in microcavity effects.

The second optical thickness auxiliary layer 227 may include a hole transporting material.

The second optical thickness auxiliary layer 227 may contact the HTL 222.

In this case, the second optical thickness auxiliary layer 227 may have satisfactory hole transport properties.

The second optical thickness auxiliary layer 227 may have a thickness of about 100 Å to about 800 Å. When the thickness of the second optical thickness auxiliary layer 227 is within this range, the second optical thickness auxiliary layer 227 may adjust the optical thickness without a substantial increase in driving voltage, and thus colored images are satisfactorily displayed.

Due to the deposition of the second optical thickness auxiliary layer 227, in comparing the emission regions formed in the first sub-pixel SP1 and the second sub-pixel SP2 with the emission region formed in the third sub-pixel SP3, it is seen that the thickness of the emission layers in the first and second sub-pixels SP1 and SP2 may be different from that of the emission layer in the third sub-pixel SP3.

A material for forming the second optical thickness auxiliary layer 227 may be a first hole transporting compound, which will be described later. In addition, the material for forming the second optical thickness auxiliary layer 227 may be any known hole transporting material, for example, a carbazole derivative such as N-phenylcarbazole, polyvinylcarbazole, or the like, or an amine derivative having aromatic condensed rings such as TPD or NPB; however, the present invention is not limited thereto.

The second organic emission layer 232 is formed on the second optical thickness auxiliary layer 227 in the second sub-pixel SP2. The second organic emission layer 232 may emit green visible rays.

The second organic emission layer 232 may be formed of various known light emitting materials, and may be formed using any known host and any known dopant. As the dopant, any known fluorescent dopant or any known phosphorescent dopant may be used. Examples of the host include, but are not limited to, $Alq_3$, 4,4'-bis(carbazole-9-yl)biphenyl (CBP), 9,10-di(naphthalene-2-yl)anthracene (ADN), and distyrylarylene (DSA). Examples of a green dopant may include, but are not limited to, $Ir(ppy)_3$ (ppy=phenylpyridine), $Ir(ppy)_2$(acac), $Ir(mpyp)_3$, and 2,3,6,7-tetrahydro-1,1,7,7-tetramethyl-1H,5H,11H-10-(2-benzothiazolyl)quinolizino[9,9a,1gh]coumarin) (C545T). When the second organic emission layer 232 includes a host and a dopant, the amount of the dopant may be generally in the range of about 0.01 to about 15 parts by weight based on 100 parts by weight of the host; however, the present invention is not limited thereto.

The second organic emission layer 232 may have a thickness in the range of about 50 Å to about 500 Å. When the thickness of the second organic emission layer 232 is within this range, colored images are satisfactorily displayed without a substantial increase in driving voltage.

Next, the third organic emission layer 233 is formed on the second organic emission layer 232 over the first sub-pixel SP1, the second sub-pixel SP2, and the third sub-pixel SP3. In particular, the third organic emission layer 233 of the first sub-pixel SP1 is formed on the second optical thickness auxiliary layer 227, the third organic emission layer 233 of the second sub-pixel SP2 is formed on the second organic emission layer 232, and the third organic emission layer 233 of the third sub-pixel SP3 is formed on the HTL 222. The third organic emission layer 233 may emit blue visible rays.

When a blue emission layer is formed as a common layer, the blue emission layer may be formed on an emission layer of a red or green color, and the emission layer of the other color may be formed on the blue emission layer. Whether the blue emission layer as a common layer is formed on the emission layer of a red or green color and the emission layer of the other color is formed on the blue emission layer may be determined by the desired characteristics of the OLED of each color, or the desired degree of pattern formation of each color. If a red emission layer and a green emission layer are sequentially patterned, color mixing caused by the bleeding of the colors of the emission layers, or separation of the emission layers, or panel defects may occur. In contrast, when the blue emission layer is formed between the red emission layer and the green emission layer, color mixing caused by the bleeding of the colors of the emission layers, separation of the emission layers, and panel defects may be substantially prevented.

The third organic emission layer 233 may be formed of various known light emitting materials, and may be formed using any known host and any known dopant. As a dopant, any known fluorescent dopant and any known phosphorescent dopant may be used. Examples of the host may include, but are not limited to, $Alq_3$, CBP, AND, and DSA. Examples of a blue dopant include, but are not limited to, $F_2Irpic$, $(F_2ppy)_2Ir(tmd)$, $Ir(dfppz)_3$, ter-fluorene, 4,4"-bis[4-(di-p-tolylamino)styryl]biphenyl (DPAVBi), and 2,5,8,11-tetra-t-butylperylene (TBP). When the third organic emission layer 233 includes a host and a dopant, the amount of the dopant may be generally in the range of about 0.01 to about 15 parts by weight based on 100 parts by weight of the host; however, the present invention is not limited thereto.

The third organic emission layer 233 may have a thickness in the range of about 50 Å to about 500 Å. When the thickness of the third organic emission layer 233 is within this range, colored images are satisfactorily displayed without a substantial increase in driving voltage.

The first optical thickness auxiliary layer 225 is formed on the third organic emission layer 233 in the first sub-pixel SP1, and is not formed in the second sub-pixel SP2 and the third sub-pixel SP3. The first optical thickness auxiliary layer 225 is formed to adjust the optical thickness of the first organic emission layer 231. The first optical thickness auxiliary layer 225 differentiates the length between the first electrode 210 and the second electrode 250 in the first sub-pixel SP1 from the length between the first electrode 210 and the second electrode 250 in the second sub-pixel SP2 and the third sub-pixel SP3, and thus the optical path length of visible rays emitted from the organic emission layer 230 is different for each sub-pixel, resulting in microcavity effects.

The first optical thickness auxiliary layer 225 may include a first hole transporting compound and a cyano group-containing compound.

The cyano group-containing compound may be at least one compound represented by Formulae 1 through 20 below:

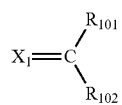

Formula 1

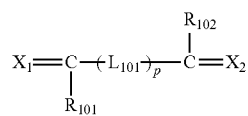

Formula 2

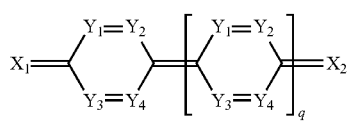

Formula 3

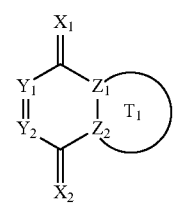

Formula 4

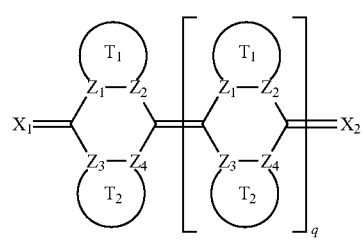

Formula 5

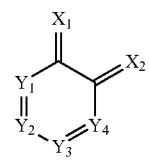

Formula 6

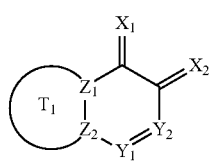

Formula 7

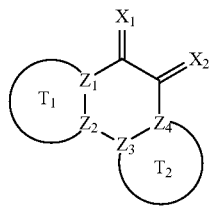

Formula 8

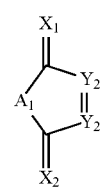

Formula 9

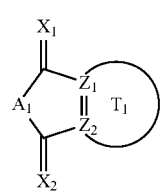

Formula 10

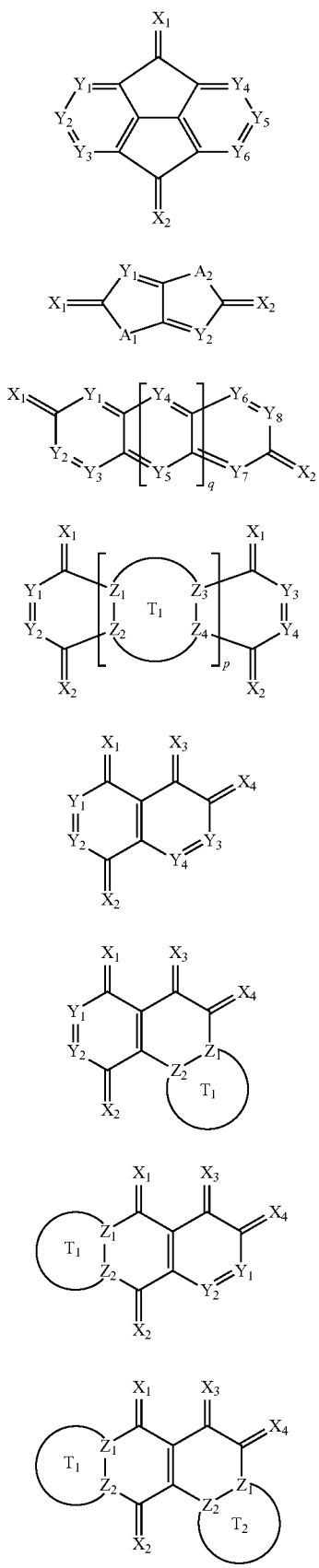

Formula 11

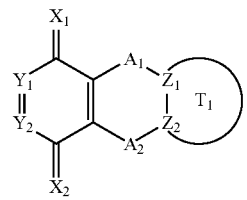

Formula 12

Formula 13

Formula 14

Formula 15

Formula 16

Formula 17

Formula 18

Formula 19

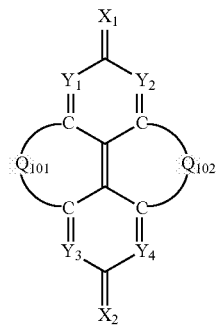

Formula 20

In Formulae 1 through 20, each of $X_1$, $X_2$, $X_3$, and $X_4$ may be independently selected from

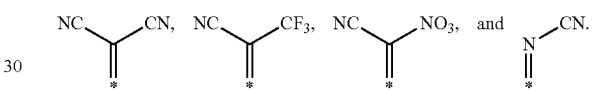

Each of $Y_1$ through $Y_8$ is independently N or $CR_{103}$. Each of $Z_1$, $Z_2$, $Z_3$, and $Z_4$ is independently CH or N. Each of $A_1$ and $A_2$ is independently one of O, S, $NR_{104}$, and $C(R_{105})(R_{106})$. $L_{101}$ is a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group. Each of $Q_{101}$ and $Q_{102}$ is independently a substituted or unsubstituted $C_1$-$C_{30}$ alkylene group or a substituted or unsubstituted $C_2$-$C_{30}$ alkenylene group. Each of $T_1$ and $T_2$ is independently a substituted or unsubstituted $C_5$-$C_{30}$ aromatic ring system or a substituted or unsubstituted $C_3$-$C_{30}$ heteroaromatic ring system. Each of $R_{101}$, $R_{102}$, $R_{103}$, $R_{104}$, $R_{105}$, and $R_{106}$ is independently one of a hydrogen atom, a deuterium atom, a halogen atom, a hydroxyl group, a cyano group, a nitro group, a carboxyl group,

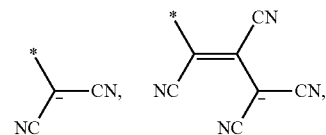 [SMILES: *[C-](C#N)C#N ; */C(C#N)=C(\C#N)[C-](C#N)C#N]

a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, and $N(R_{107})(R_{108})$. Each of $R_{107}$ and $R_{108}$ is independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_5$-$C_{30}$ aryl group, or a substituted or unsubstituted $C_3$-$C_{30}$ heteroaryl group. Also, p is an integer of 1 to 10, and q is an integer of 0 to 10.

For example, each of $X_1$, $X_2$, $X_3$, and $X_4$ may be independently

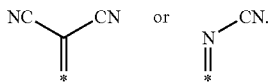

For example, $L_{101}$ may be a substituted or unsubstituted thiophenylene group or a substituted or unsubstituted benzothiophenylene group.

For example, each of $T_1$ and $T_2$ may be independently a substituted or unsubstituted benzene, a substituted or unsubstituted naphthalene, a substituted or unsubstituted anthracene, a substituted or unsubstituted thiophene, a substituted or unsubstituted thiadiazole, or a substituted or unsubstituted oxadiazole.

For example, $R_{103}$ may be a hydrogen atom, a halogen atom, a cyano group, a substituted or unsubstituted $C_1$-$C_{10}$ alkyl group, a substituted or unsubstituted $C_1$-$C_{30}$ alkoxy group, or $N(R_{107})(R_{108})$. Each of $R_{107}$ and $R_{108}$ may be independently a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, or a substituted or unsubstituted methylnaphthyl group.

In particular, the cyano group-containing compound may be at least one compound represented by Formulae 1A through 20B:

Formula 1A

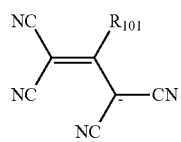

Formula 1B

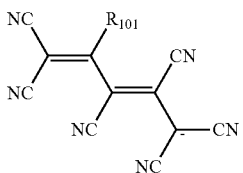

Formula 2A

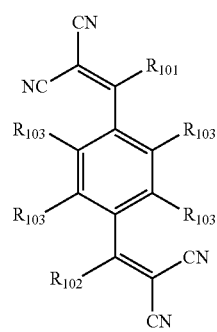

Formula 2B

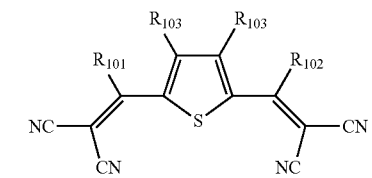

Formula 2C

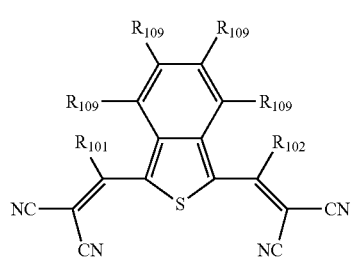

Formula 3A

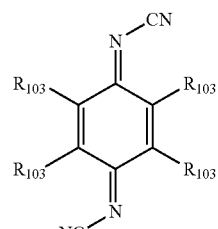

Formula 3B

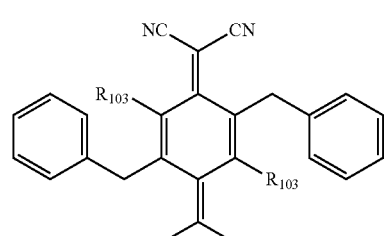

Formula 3C

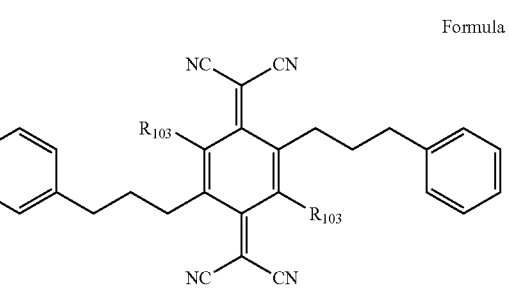

Formula 3D

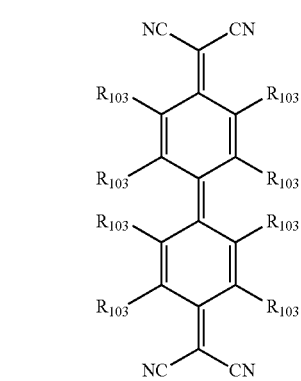

Formula 4A
Formula 4B
Formula 5A
Formula 5B
Formula 5C
Formula 5D
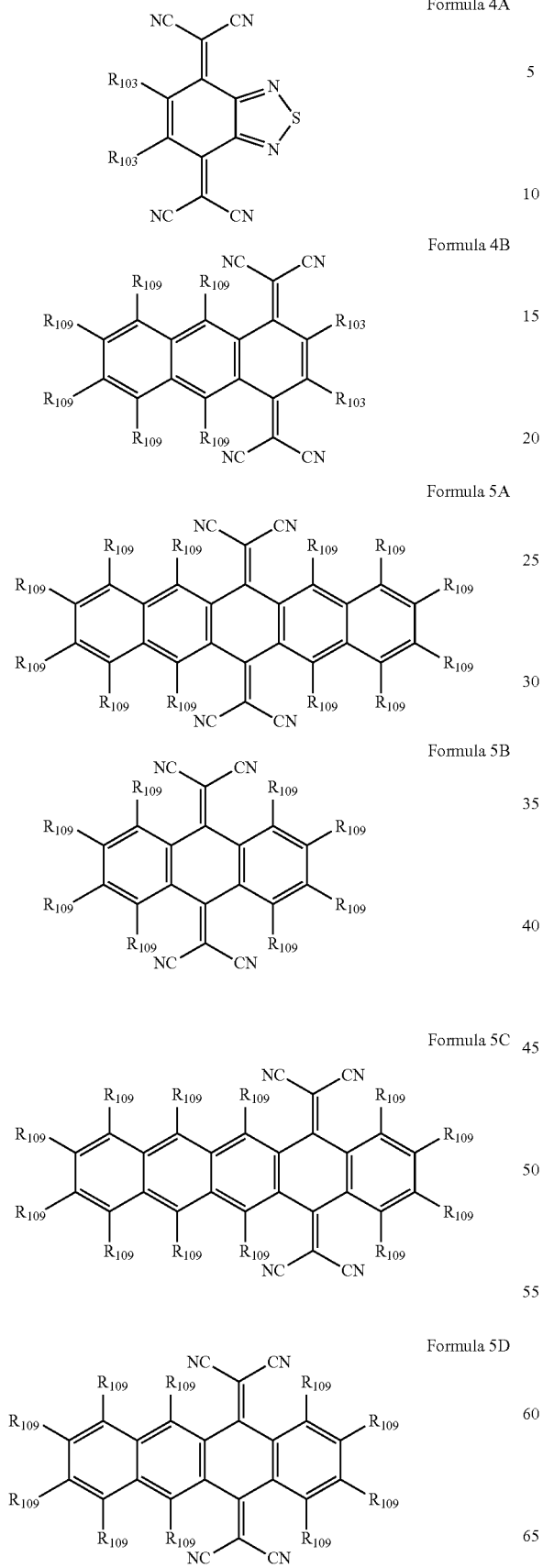
Formula 5E
Formula 5F
Formula 5G
Formula 5H
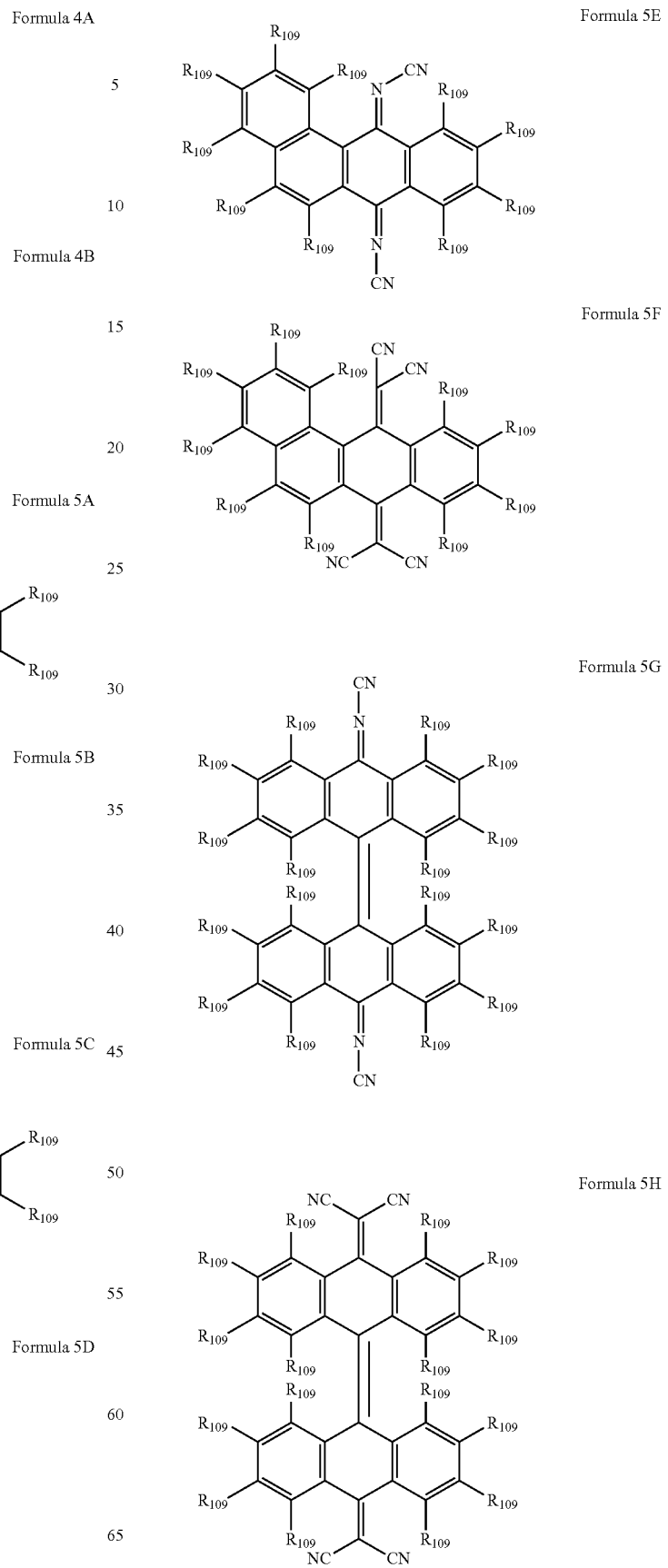

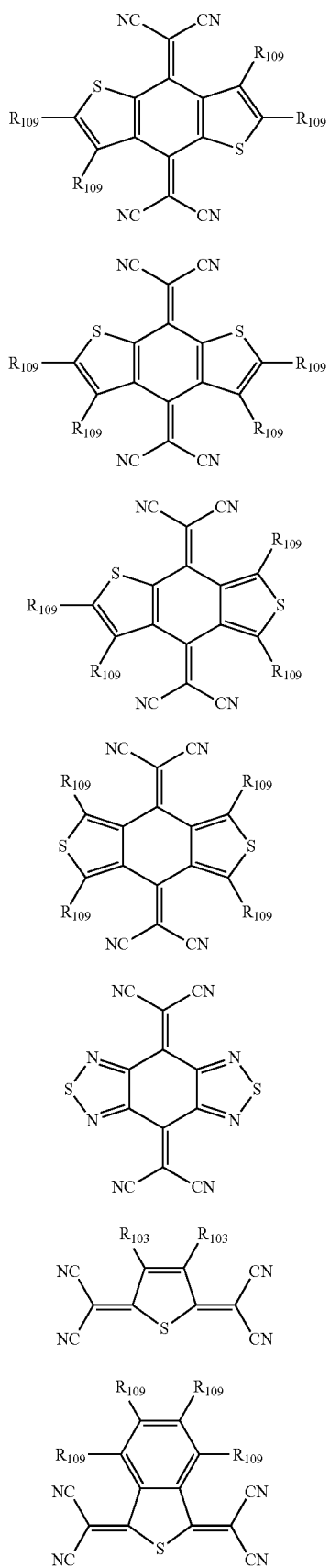
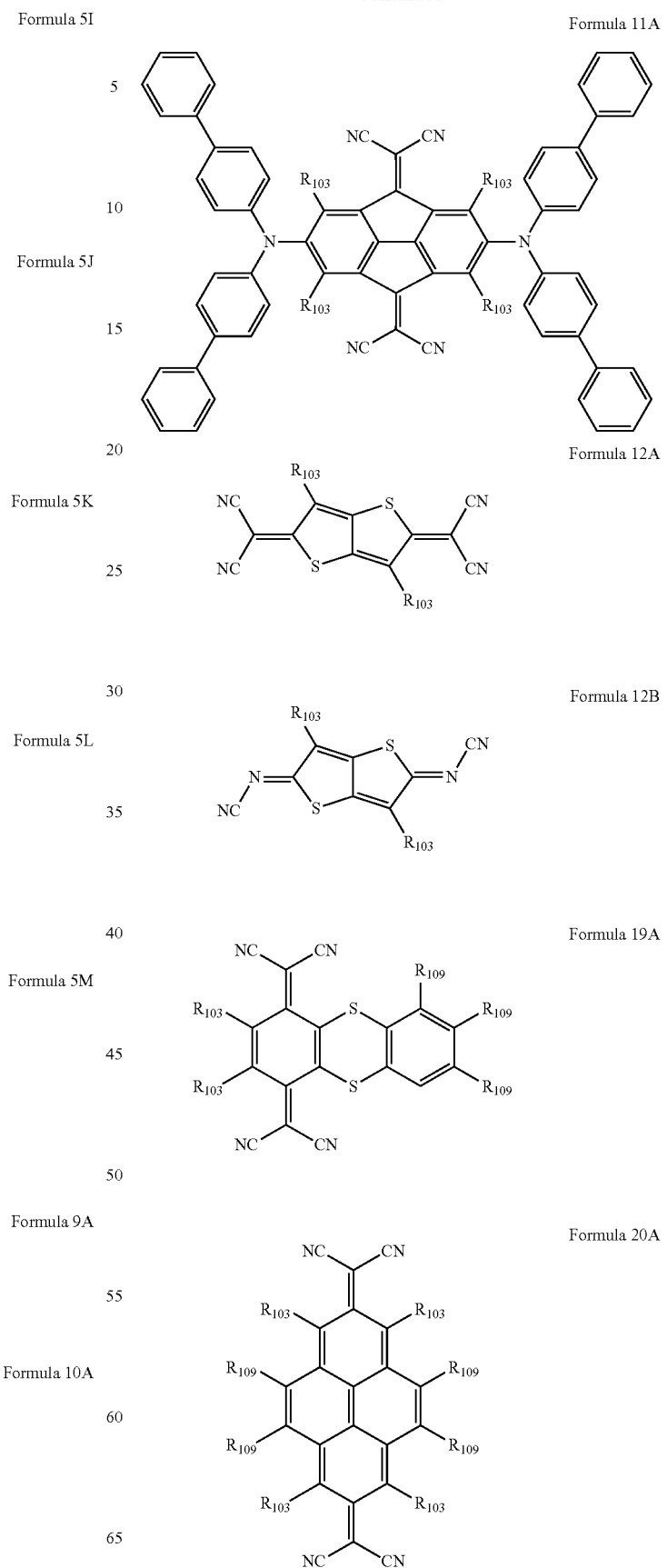

-continued

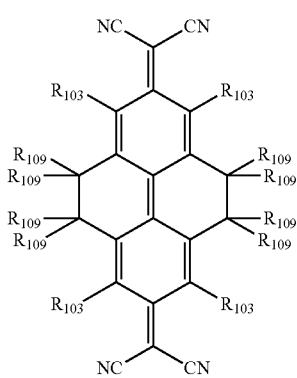

Formula 20B

In the above Formulae 1A through 20B, each of $R_{101}$, $R_{102}$, $R_{103}$ and $R_{109}$ may be independently a hydrogen atom, a fluorine atom, a cyano group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted methoxy group, a substituted or unsubstituted ethoxy group, or a substituted or unsubstituted propoxy group.

The first hole transporting compound may be at least one compound represented by Formulae 101 and 102:

Formula 101

$$R_1\!-\!(L_1)_a\!-\!N\!\begin{smallmatrix}R_3\\R_2\end{smallmatrix}$$

Formula 102

(structure with $R_{10}$ through $R_{26}$, $L_{11}$, b)

In Formulae 101 and 102, $R_{10}$ is —$(Ar_1)_n$—$Ar_2$. $R_{11}$ is —$(Ar_{11})_m$—$Ar_{12}$. Each of $L_1$, $L_{11}$, $Ar_1$ and $Ar_{11}$ is independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, or —$N(Q_1)$-. Each of $R_1$ through $R_3$, $R_{12}$ through $R_{26}$, $Ar_2$, $Ar_{12}$, and $Q_1$ is independently a hydrogen atom, a deuterium atom, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_3$-$C_{30}$ heteroaryl group, or a group represented by —$N(Q_2)(Q_3)$. Each of $Q_2$ and $Q_3$ is independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, or a substituted or unsubstituted $C_3$-$C_{30}$ heteroaryl group. Each of a, b, m, and n is independently an integer of 0 to 10. However, the $Ar_1$ groups in —$(Ar_1)_n$— may be the same as or different from each other, the $Ar_{11}$ groups in —$(Ar_{11})_m$— may be the same as or different from each other, the $L_1$ groups in -$(L_1)_a$- may be the same as or different from each other, and the $L_{11}$ groups in -$(L_{11})_b$- may be the same as or different from each other.

For example, the first hole transporting compound may be at least one of Compounds 101 through 137 below:

Compound 101

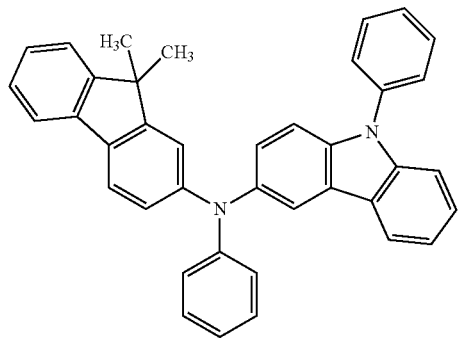

Compound 102

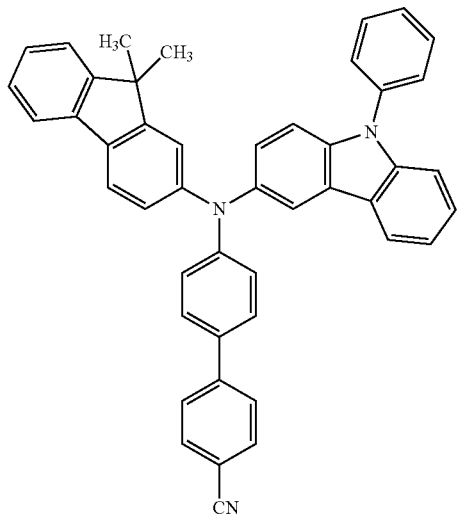

-continued
Compound 103
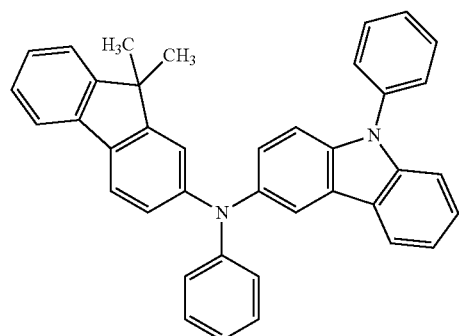
Compound 104
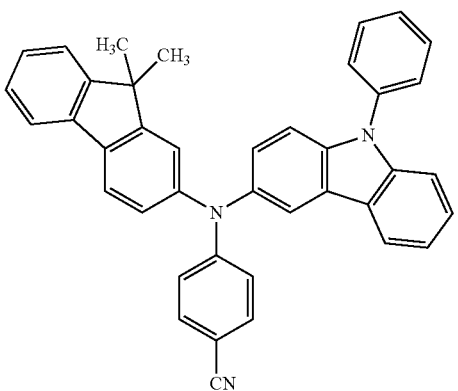
Compound 105
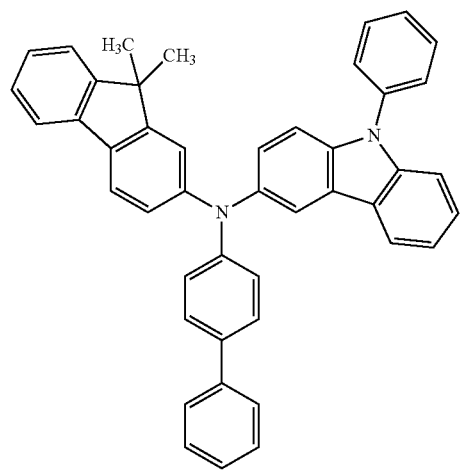
Compound 106
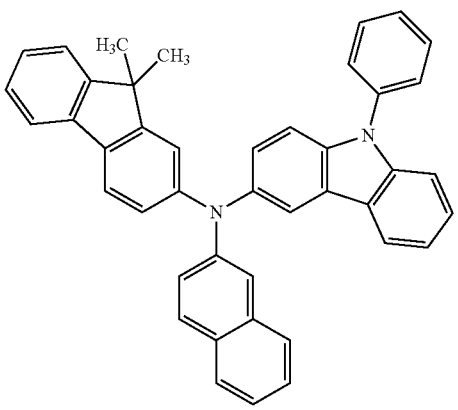
Compound 107
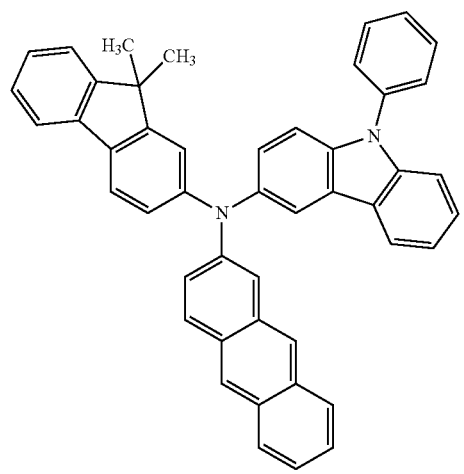
Compound 108
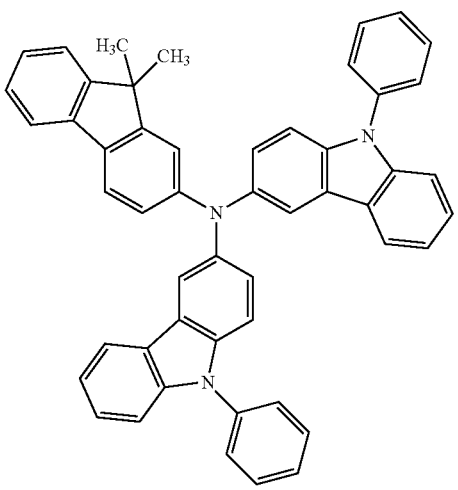

-continued
Compound 109
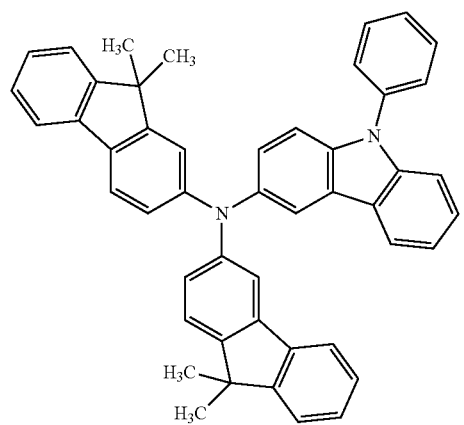
Compound 110
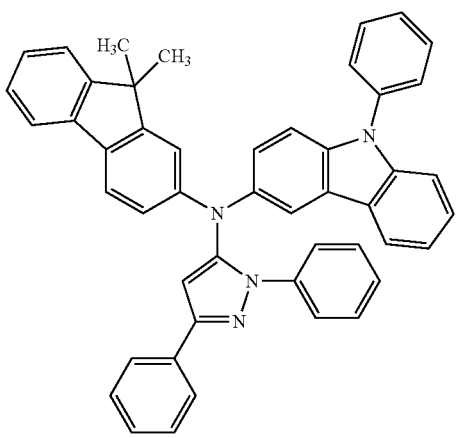
Compound 111
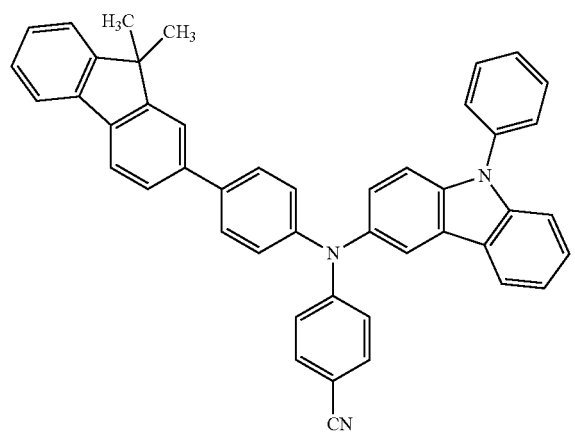
Compound 112
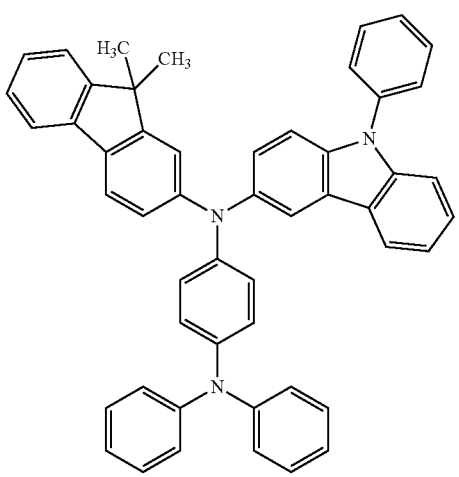
Compound 113
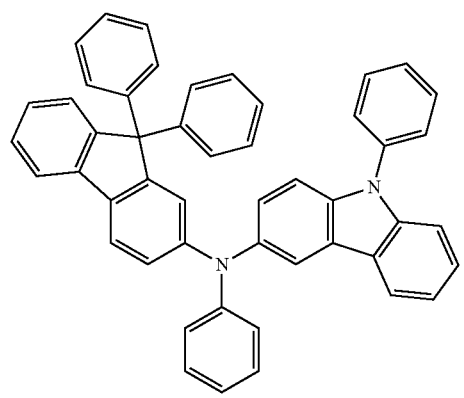
Compound 114
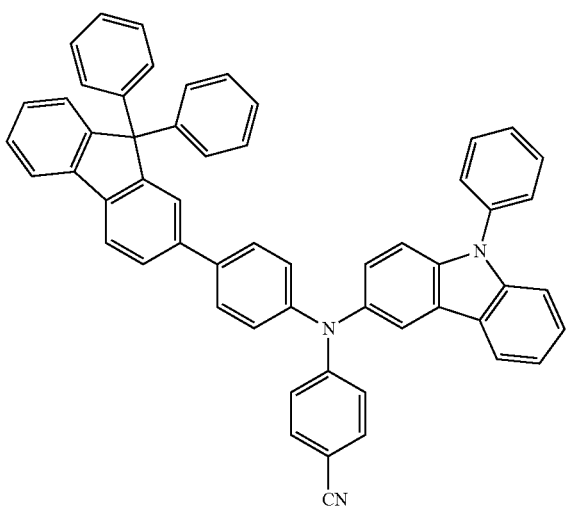

-continued
Compound 115
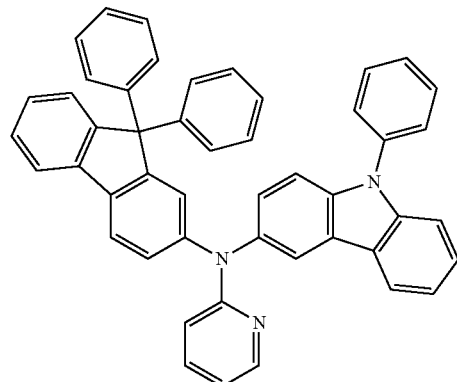
Compound 116
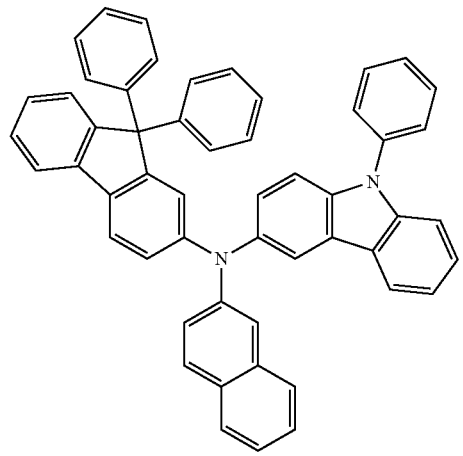
Compound 117
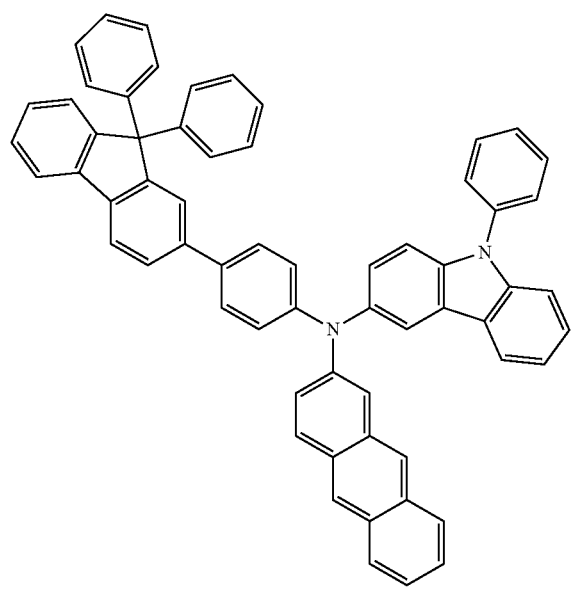
Compound 118
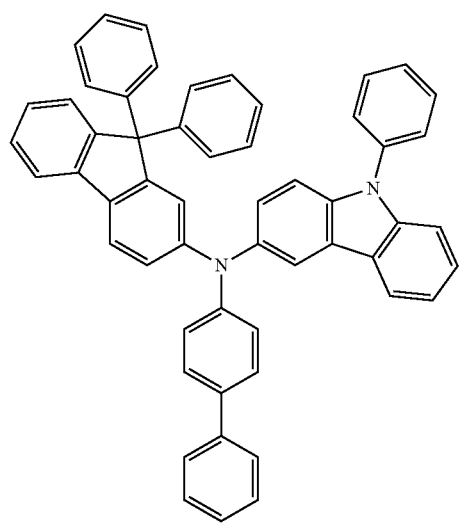
Compound 119
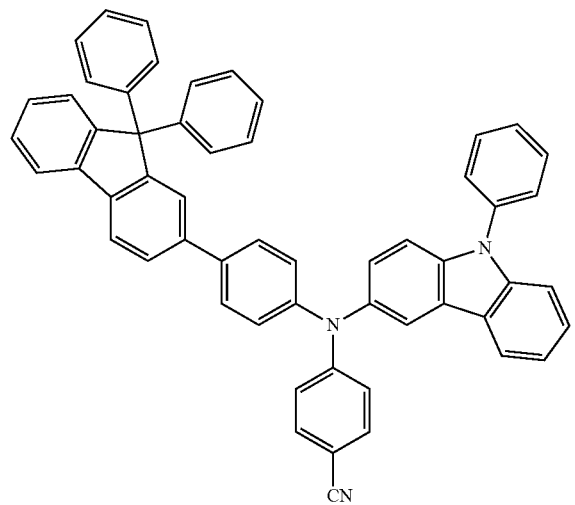
Compound 120
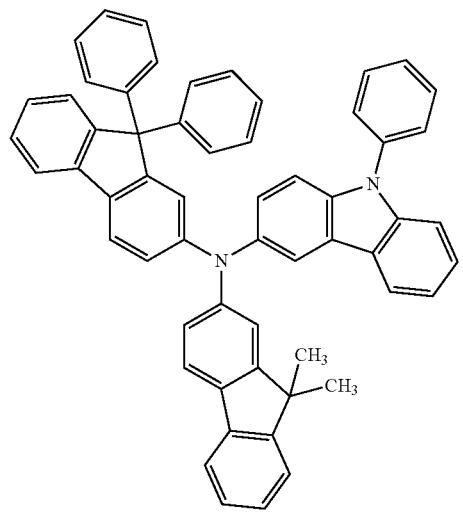

-continued
Compound 121
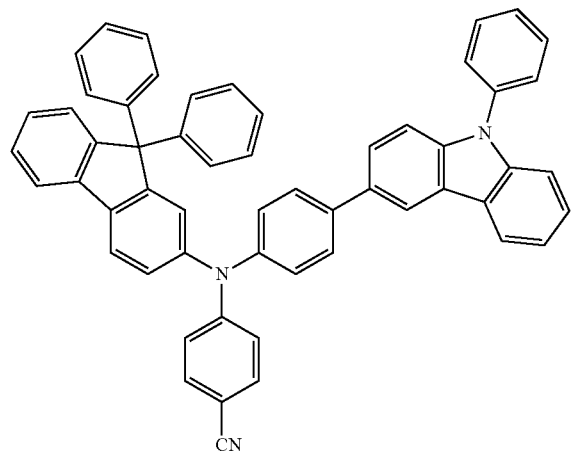
Compound 122
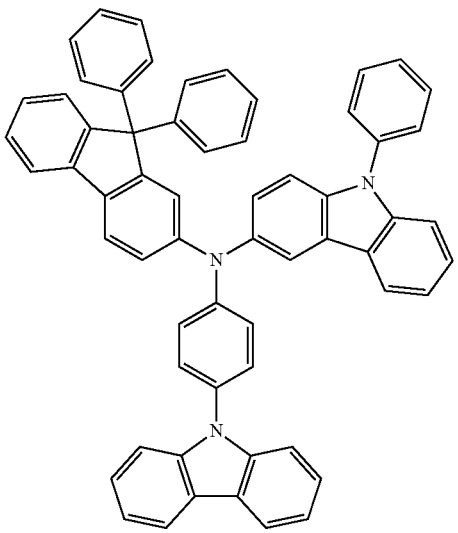
Compound 123
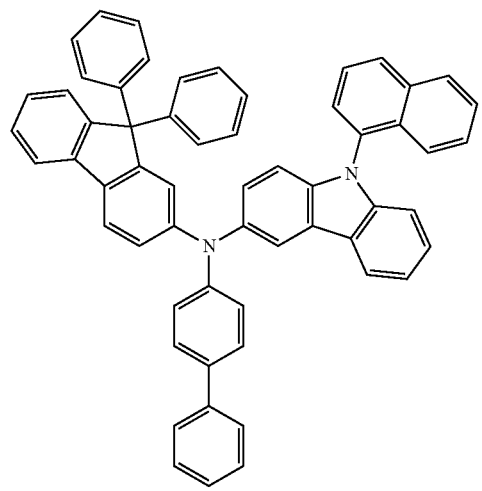
Compound 124
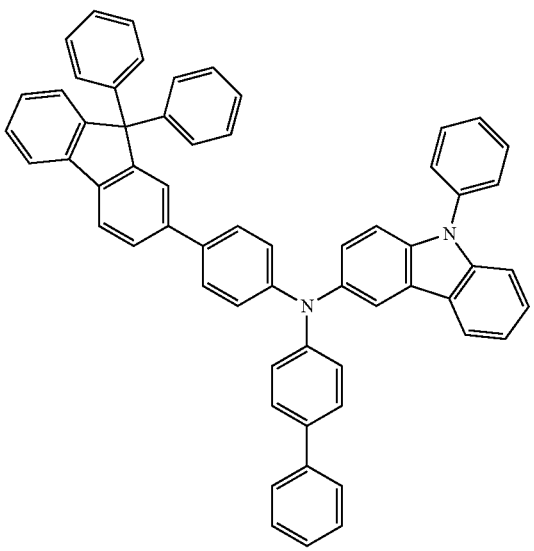
Compound 125
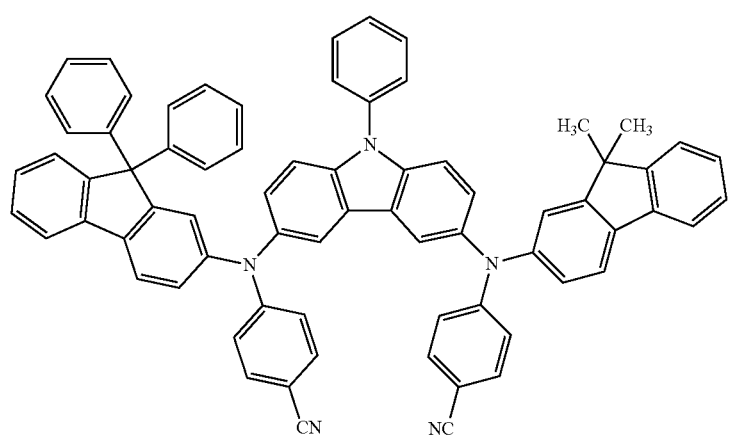

Compound 126
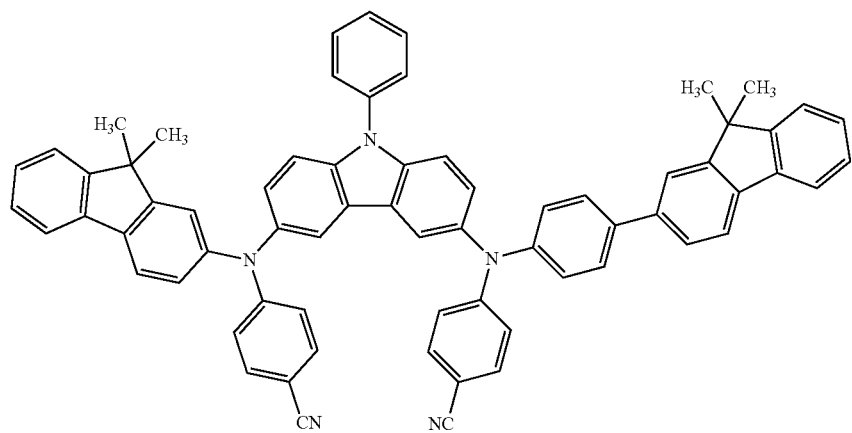
Compound 127
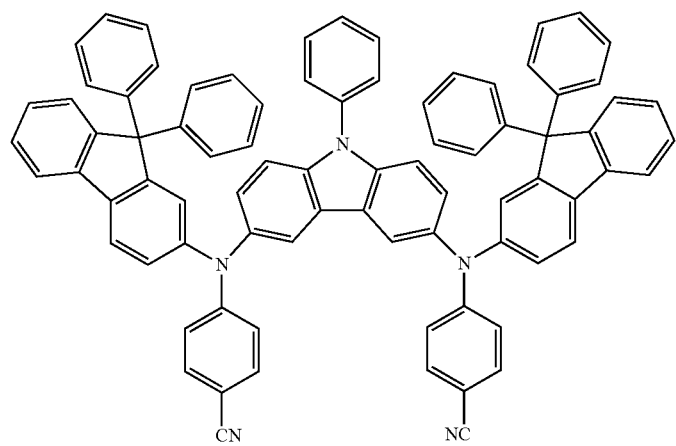
Compound 128
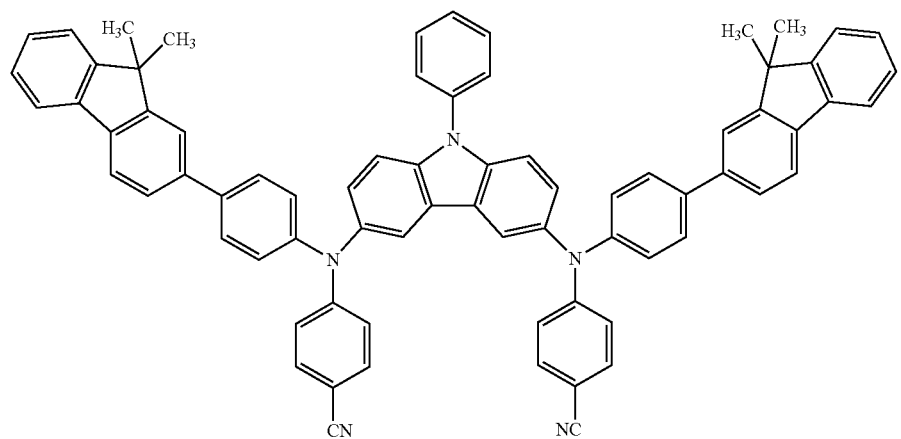

-continued
Compound 129
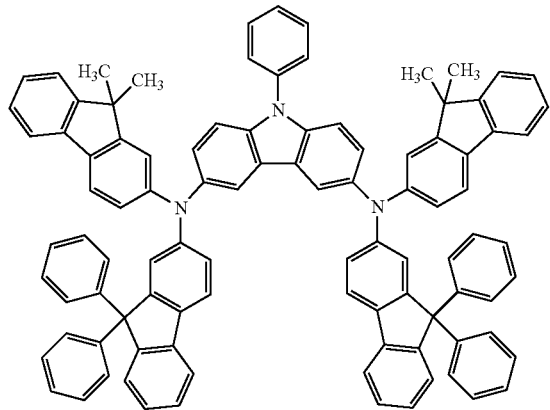
Compound 130
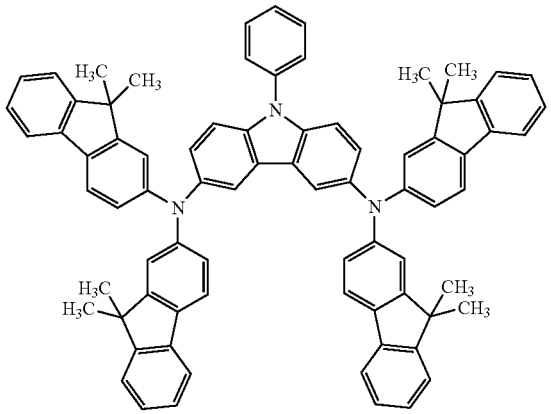
Compound 131
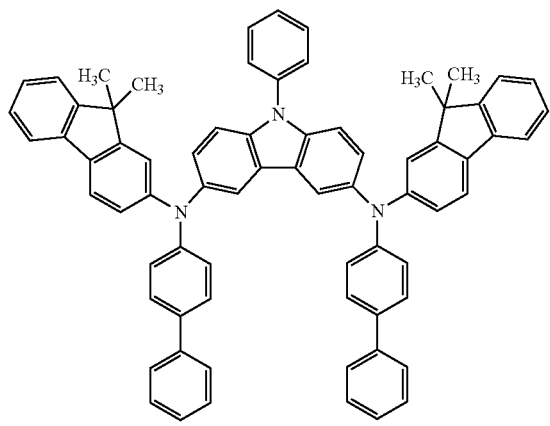
Compound 132
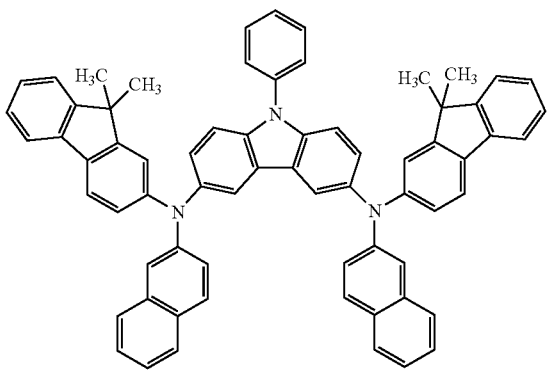
Compound 133
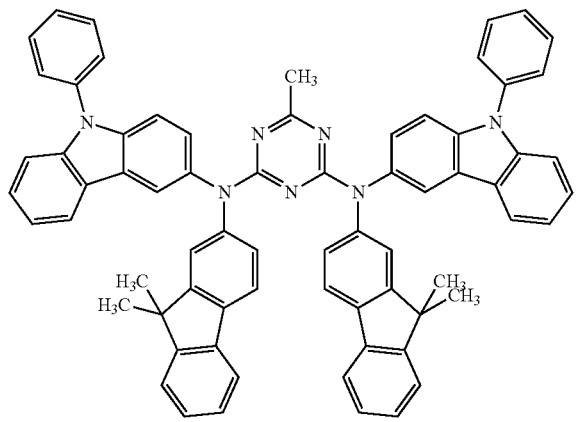
Compound 134
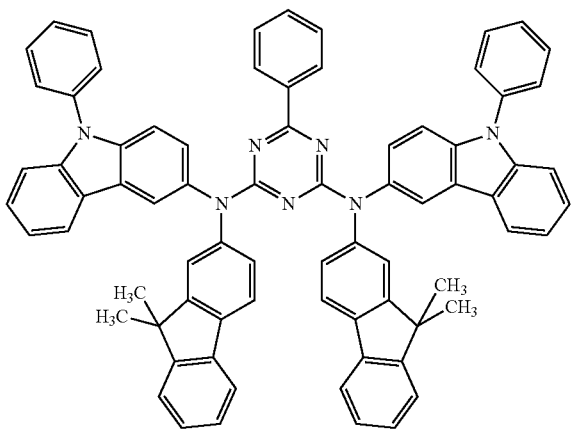

-continued

Compound 135

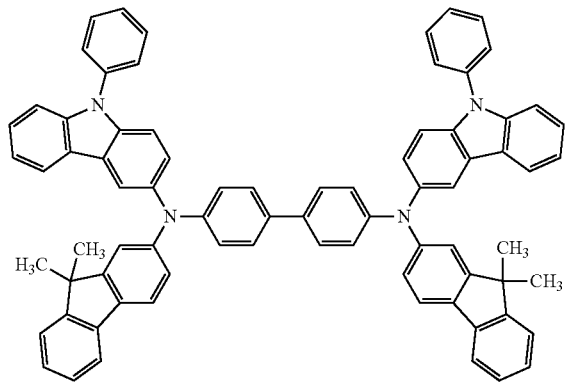

Compound 136

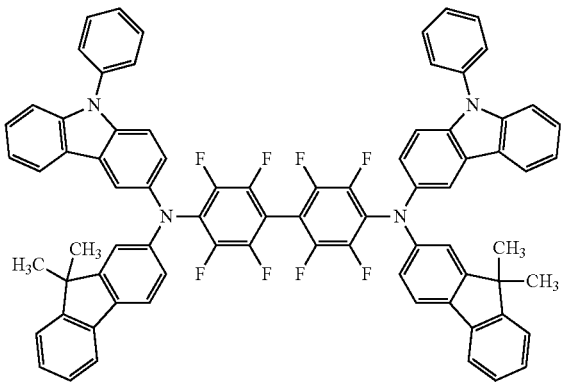

Compound 137

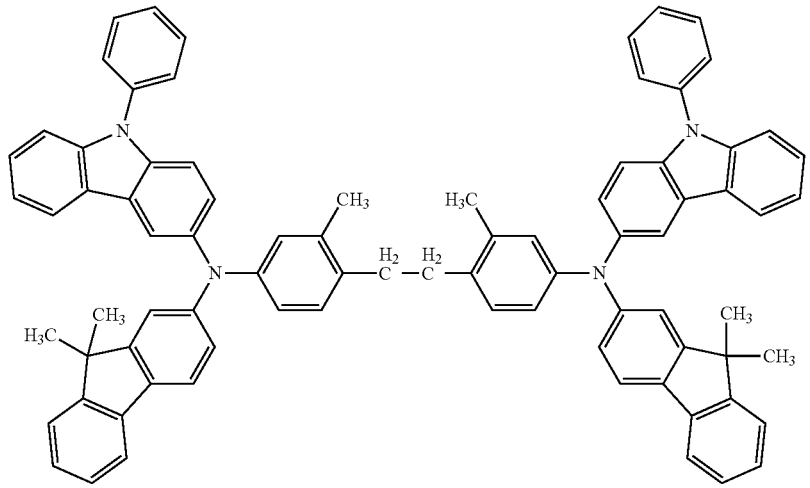

For example, the first optical thickness auxiliary layer 225 may be formed by doping the first hole transporting compound with the cyano group-containing compound.

The first optical thickness auxiliary layer 225 may include about 0.1 to about 1.0 part by weight of the cyano group-containing compound based on 100 parts by weight of the first optical thickness auxiliary layer 225.

The first optical thickness auxiliary layer 225 may contact the first organic emission layer 231 and the third organic emission layer 233. In this case, the first optical thickness auxiliary layer 225 may have satisfactory hole transport properties.

The first optical thickness auxiliary layer 225 may have a thickness in the range of about 100 Å to about 800 Å. When the thickness of the first optical thickness auxiliary layer 225 is within this range, colored images are satisfactorily displayed without a substantial increase in driving voltage.

Due to the deposition of the first optical thickness auxiliary layer 225, in comparing the emission region formed in the first sub-pixel SP1 with the emission regions respectively formed in the second sub-pixel SP2 and the third sub-pixel SP3, the thickness of the emission layer in the first sub-pixel SP1 may be different from that of the emission layers in the second and third sub-pixels SP2 and SP3.

The first organic emission layer 231 is formed on the first optical thickness auxiliary layer 225 in the first sub-pixel SP1. The first organic emission layer 231 may emit red visible rays.

The first organic emission layer 231 may be formed of various known light emitting materials, and may be formed using any known host and any known dopant. As a dopant, any known fluorescent dopant and any known phosphorescent dopant may be used. Examples of the host may include, but are not limited to, $Alq_3$, CBP, AND, and DSA. Examples of a red dopant include, but are not limited to, PtOEP, tris(1-phenylisoquinoline)iridium(III) ($Ir(piq)_3$), $Btp_2Ir(acac)$, and DCJTB. When the first organic emission layer 231 includes a host and a dopant, the amount of the dopant may be generally in the range of about 0.01 to about 15 parts by weight based on 100 parts by weight of the host; however, the present invention is not limited thereto.

The first organic emission layer 231 may have a thickness in the range of about 200 Å to about 800 Å. When the thickness of the first organic emission layer 231 is within this range, colored images are satisfactorily displayed without a substantial increase in driving voltage.

Next, the ETL 241 and the EIL 242 are sequentially formed on the organic emission layer 230 over the first, second and third sub-pixels SP1, SP2 and SP3. The deposition of the ETL 241 and the EIL 242 is not limited to the above example, and the ETL 241 and the EIL 242 may not be formed, or only one of the ETL 241 and the EIL 242 may be formed. For example, the EIL 242 may not be formed, and only the ETL 241 may be formed.

The ETL 241 may include any known electron transporting material. Examples of the electron transporting material include, but are not limited to, a quinoline derivative, in particular, $Ir(piq)_3$, TAZ, BALq, and beryllium bis(benzoquinolin-10-olate) ($Bebq_2$).

The ETL 241 may have a thickness in the range of about 100 Å to about 1,000 Å, for example, in the range of about 150 Å to about 500 Å. When the thickness of the ETL 241 is within these ranges, the ETL 241 may have satisfactory electron transport properties without a substantial increase in driving voltage.

The EIL 242, which facilitates electron injection from the second electrode 250, may be formed on the ETL 241. A material for forming the EIL 242 may be any known material for forming an EIL such as LiF, NaCl, CsF, $Li_2O$, or BaO.

The EIL 242 may have a thickness in the range of about 1 Å to about 100 Å, for example, in the range of about 3 Å to about 90 Å. When the thickness of the EIL 242 is within these ranges, the EIL 242 may have satisfactory electron injection properties without a substantial increase in driving voltage.

The second electrode 250 is formed on the EIL 242. The second electrode 250 may be a transparent electrode or a reflective electrode. As a transparent electrode, the second electrode 250 may be formed by depositing a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, and then forming an auxiliary electrode layer or bus electrode line on the metal using a transparent conductive material such as ITO, IZO, ZnO or $In_2O_3$.

As a reflective electrode, the second electrode 250 may be formed of a metal having a low work function such as Ag, Mg, Al, Pt, Pd, Au, Ni, Nd, Ir, Cr, Li, or Ca.

A sealing member (not shown) may be formed on the second electrode 250 facing a surface of the substrate 201. The sealing member is formed to protect the organic emission layer from external moisture or oxygen, and is formed of a transparent material. For example, the sealing member may be formed of glass or plastic, or may have a stacked structure including a plurality of organic and inorganic materials.

The OLED 200 may further include a passivation layer (not shown) between the HTL 222 and the intermediate layer 223. In particular, the first sub-pixel SP1 may include the substrate 201, and the first electrodes 210, the HIL 221, the intermediate layer 223, the passivation layer (not shown), the HTL 222, the second optical thickness auxiliary layer 227, the third organic emission layer 233, the first optical thickness auxiliary layer 225, the first organic emission layer 231, the ETL 241, the EIL 242, and the second electrode 259 are sequentially formed on the substrate 201. The second sub-pixel SP2 may include the substrate 201, and the first electrodes 210, the HIL 221, the intermediate layer 223, the passivation layer (not shown), the HTL 222, the second optical thickness auxiliary layer 227, the second organic emission layer 232, the third organic emission layer 233, the ETL 241, the EIL 242, and the second electrode 250 are sequentially formed on the substrate 201. The third sub-pixel (SP3) may include the substrate 201, and the first electrodes 210, the HIL 221, the intermediate layer 223, the passivation layer (not shown), the HTL 222, the third organic emission layer 233, the ETL 241, the EIL 242, and the second electrode 250 are sequentially formed on the substrate 201. The passivation layer may be formed of the first hole transporting compound described above or any known hole injection material.

The term "substituted" in the phrase "substituted or unsubstituted" when describing a particular group, as used herein, indicates that at least one hydrogen atom of the group is substituted with a substituent selected from a deuterium atom, a halogen atom, a hydroxyl group, a cyano group, a nitro group, a carboxyl group or a salt derivative thereof, a sulfonic acid group or a salt derivative thereof, a phosphoric acid group or a salt derivative thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, a $C_3$-$C_{30}$ heteroaryl group, a group represented by $N(Q_{201})(Q_{202})$, and a group represented by $Si(Q_{203})(Q_{204})(Q_{205})$. Each of $Q_{201}$ through $Q_{205}$ may be independently a hydrogen atom, a deuterium atom, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_5$-$C_{30}$ aryl group, a $C_5$-$C_{30}$ aryloxy group, a $C_5$-$C_{30}$ arylthio group, or a $C_3$-$C_{30}$ heteroaryl group.

For example, the term "substituted," as used herein, indicates that at least one hydrogen atom of the group is substituted with one selected from a deuterium atom, a halogen atom, a hydroxyl group, a cyano group, a nitro group, a carboxyl group, a methyl group, an ethyl group, a propyl group, a butyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, and a dibenzothiophenyl group.

The unsubstituted $C_1$-$C_{30}$ alkyl group denotes a saturated hydrocarbon group having a linear or branched structure in which one hydrogen atom is removed from the corresponding alkane. Examples of the unsubstituted $C_1$-$C_{30}$ alkyl group may include methyl, ethyl, propyl, isobutyl, sec-butyl, pentyl, iso-amyl, hexyl, and the like. A detailed description of the substituents of the substituted $C_1$-$C_{30}$ alkyl group is provided above in the description of the term "substituted."

The unsubstituted $C_2$-$C_{30}$ alkenyl group denotes a group containing at least one carbon-to-carbon double bond at the middle or the end of the unsubstituted $C_2$-$C_{30}$ alkyl group. Examples of the unsubstituted $C_2$-$C_{30}$ alkenyl group may include ethenyl, propenyl, butenyl, pentenyl, hexenyl, heptenyl, octenyl, propadienyl, isoprenyl, allyl, and the like. A detailed description of the substituents of the substituted $C_2$-$C_{30}$ alkenyl group is provided above in the description of the term "substituted."

The unsubstituted $C_2$-$C_{30}$ alkynyl group denotes a group containing at least one carbon-to-carbon triple bond at the middle or the end of the unsubstituted $C_2$-$C_{60}$ alkyl group. The unsubstituted $C_2$-$C_{30}$ alkynyl group may be acetylenyl. A detailed description of the substituents of the substituted $C_2$-$C_{30}$ alkynyl group is provided above in the description of the term "substituted."

The unsubstituted $C_1$-$C_{30}$ alkoxy group has the Formula —OY (where Y is the unsubstituted $C_1$-$C_{30}$ alkyl group) and may be, for example, methoxy, ethoxy, isopropyloxy, butoxy, pentoxy, and the like. A detailed description of the substituents of the substituted $C_1$-$C_{30}$ alkoxy group is provided above in the description of the term "substituted."

The unsubstituted $C_3$-$C_{30}$ cycloalkyl group denotes a ring-type saturated hydrocarbon group, and may be, for example, cyclopropyl, cyclobutyl, cyclopentyl, cyclohexyl, cyclooctyl, and the like. A detailed description of the substituents of the substituted $C_3$-$C_{30}$ cycloalkyl group is provided above in the description of the term "substituted."

The unsubstituted $C_3$-$C_{30}$ cycloalkenyl group denotes a ring-type unsaturated hydrocarbon group having at least one carbon-to-carbon double bond and that is not an aromatic ring. Examples of the unsubstituted $C_3$-$C_{30}$ cycloalkenyl group may include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cyclooctadienyl group, and the like. A detailed description of the substituents of the substituted $C_3$-$C_{60}$ cycloalkenyl group is provided above in the description of the term "substituted."

The unsubstituted $C_5$-$C_{30}$ aryl group denotes a monovalent group having a $C_5$-$C_{30}$ carbocyclic aromatic system, wherein the monovalent group may be a monocyclic or polycyclic group. In the polycyclic group, at least two rings included therein may be fused with each other. Examples of the unsubstituted $C_5$-$C_{30}$ aryl group may include phenyl, pentalenyl, indenyl, naphthyl, azulenyl, heptalenyl, indacenyl, acenaphthyl, fluorenyl, spiro-fluorenyl, phenalenyl, phenanthrenyl, anthryl, fluoranthrenyl, triphenylenyl, pyrenyl, chrysenyl, naphthacenyl, picenyl, perylenyl, pentaphenyl, hexacenyl, and the like. A detailed description of the substituents of the substituted $C_5$-$C_{30}$ aryl group is provided above in the description of the term "substituted."

The unsubstituted $C_5$-$C_{30}$ aryloxy group denotes a monovalent group to which carbon atoms of a $C_5$-$C_{30}$ aryl group are attached through an oxygen linking group (—O—). A detailed description of the substituents of the substituted $C_5$-$C_{30}$ aryloxy group is provided above in the description of the term "substituted."

The unsubstituted $C_5$-$C_{30}$ arylthio group denotes a monovalent group to which carbon atoms of a $C_5$-$C_{30}$ aryl group are attached through a sulfur linking group (—S—). Examples of the unsubstituted $C_5$-$C_{30}$ arylthio group may include phenylthio, naphthylthio, indanylthio, and indenylthio. A detailed description of the substituents of the substituted $C_5$-$C_{30}$ arylthio group is provided above in the description of the term "substituted."

The unsubstituted $C_3$-$C_{30}$ heteroaryl group denotes a monovalent group including at least one ring containing at least one heteroatom selected from the group consisting of N, O, P, and S, wherein the monovalent group is monocyclic or polycyclic. In the polycyclic group, at least two rings included therein may be fused with each other. Examples of the unsubstituted $C_3$-$C_{30}$ heteroaryl group may include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazolyl, oxadiazolyl, triazinyl, benzoxazolyl, and the like. A detailed description of the substituents of the substituted $C_3$-$C_{30}$ heteroaryl group is provided above in the description of the term "substituted."

The unsubstituted $C_1$-$C_{30}$ alkylene group denotes a divalent group having a linear or branched structure in which two hydrogen atoms are removed from the corresponding alkane. Examples of the unsubstituted $C_1$-$C_{30}$ alkylene group are provided above in the description of the unsubstituted $C_1$-$C_{30}$ alkyl group. A detailed description of the substituents of the substituted $C_1$-$C_{30}$ alkylene group is provided above in the description of the term "substituted."

The unsubstituted $C_5$-$C_{30}$ arylene group denotes a divalent group having a $C_5$-$C_{30}$ carbocyclic aromatic system, wherein the divalent group may be a monocyclic or polycyclic group. Examples of the unsubstituted $C_5$-$C_{30}$ arylene group are provided above in the description of the unsubstituted $C_5$-$C_{30}$ aryl group. A detailed description of the substituents of the substituted $C_5$-$C_{30}$ arylene group is provided above in the description of the term "substituted."

According to another embodiment of the present invention, a flat display device includes a transistor including a source electrode, a drain electrode, a gate electrode, and an active layer; and the OLED described above. One of the source electrode and the drain electrode is electrically connected to the first electrode of the OLED.

An OLED according to an embodiment of the present invention will now be described in more detail with reference to the following Examples. These Examples are presented for illustrative purposes only and are not intended to limit the scope of the invention.

EXAMPLE 1

As an anode, 15 Ω/cm² (1200 Å) of an ITO glass substrate from Corning Co., Ltd. was cut to a size of 50 mm×50 mm×0.7 mm, and ultrasonically washed with isopropyl alcohol and pure water for 5 minutes each. Subsequently, UV rays were irradiated to the resulting ITO glass substrate for 30 minutes, and the ITO glass substrate was washed with ozone and mounted on a vacuum deposition device. 2-TNATA was vacuum deposited on the ITO glass substrate to form a hole injection layer having a thickness of 650 Å, hexa-azatriphenylene hexacarbonitrile (HAT-CN) was vacuum deposited on the hole injection layer to form an intermediate layer having a thickness of 50 Å, and 4,4'-bis[N-(1-naphthyl)-N-phenylamino]biphenyl (NPB) was vacuum deposited on the intermediate layer to form a hole transport layer having a thickness of 700 Å. Compound 105 was vacuum deposited on the hole transport layer over a first sub-pixel and a second sub-pixel to form a second optical thickness auxiliary layer having a thickness of 300 Å. ADN as a green host and C545T as a green dopant were co-deposited on the second optical thickness auxiliary layer of the second sub-pixel at a weight ratio of 98 to 2 to form a green emission layer having a thickness of 200 Å.

ADN as a blue host and DPAVBi as a blue dopant were co-deposited on the green emission layer at a weight ratio of 98 to 2 over the first sub-pixel, the second sub-pixel, and the third sub-pixel to form a blue emission layer as a common layer having a thickness of 180 Å.

Compound 105 below and Compound 20 below were co-deposited on the blue emission layer of the first sub-pixel at a weight ratio of 99.8 to 0.2 to form a first optical thickness auxiliary layer having a thickness of 350 Å, and CBP as a red host and Ir(piq$_3$) as a red dopant were co-deposited on the first optical thickness auxiliary layer of the first sub-pixel at a weight ratio of 98 to 2 to form a red emission layer having a thickness of 400 Å, thereby completing the formation of an organic emission layer.

Subsequently, $Alq_3$ was vacuum deposited on the organic emission layer to form an electron transport layer having a thickness of 300 Å. LiF was vacuum deposited on the electron transport layer to form an electron injection layer having a thickness of 10 Å, and Al was vacuum deposited to a thickness of 1,800 Å thereon to form a LiF/Al electrode, thereby completing the manufacture of an organic light-emitting diode.

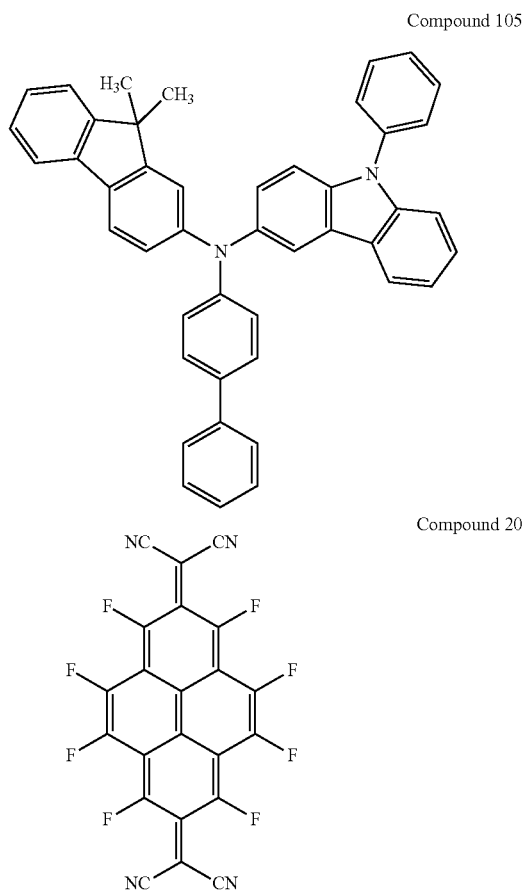

Compound 105

Compound 20

COMPARATIVE EXAMPLE 1

An organic light-emitting diode was manufactured in the same manner as in Example 1, except that, first, ADN as a blue host and DPAVBi as a blue dopant were co-deposited on the hole transport layer at a weight ratio of 98 to 2 over the first sub-pixel, the second sub-pixel, and the third sub-pixel to form a blue emission layer as a common layer having a thickness of 180 Å. HAT-CN was vacuum deposited on the blue emission layer over the first sub-pixel and the second sub-pixel to form a pure layer having a thickness of 50 Å. NPB was vacuum deposited on the pure layer over the first sub-pixel and the second sub-pixel to form a second optical thickness auxiliary layer having a thickness of 250 Å. ADN as a green host and C545T as a green dopant were co-deposited on the second optical thickness auxiliary layer in the second sub-pixel at a weight ratio of 98 to 2 to form a green emission layer having a thickness of 200 Å. NPB was vacuum deposited in the first sub-pixel to form a first optical thickness auxiliary layer, and CBP as a red host and $Ir(piq_3)$ as a red dopant were co-deposited on the first optical thickness auxiliary layer in the first sub-pixel at a weight ratio of 98 to 2 to form a red emission layer having a thickness of 400 Å, thereby completing the formation of the organic emission layer.

Current efficiency, color coordinates, driving voltage and lifetime of each of the organic light-emitting diodes manufactured according to Example 1 and Comparative Example 1 were measured, and the results are shown in Table 1 below.

TABLE 1

| | | Current efficiency (cd/A) | Color coordinates | Driving voltage (V) | Lifetime (h) |
|---|---|---|---|---|---|
| Example 1 | Red | 35.8 | (0.66, 0.34) | 5.8 | 400 |
| | Green | 50.8 | (0.21, 0.73) | 4.1 | 180 |
| | blue | 3.7 | (0.14, 0.05) | 4.1 | 20 |
| Comparative Example 1 | Red | 42.6 | (0.67, 0.33) | 4.4 | 250 |
| | Green | 53.8 | (0.21, 0.73) | 4.3 | 130 |
| | blue | 3.7 | (0.14, 0.05) | 4.1 | 20 |

Referring to Table 1, the red, green and blue diodes of the OLED of Example 1 exhibit characteristics substantially similar to those of the red, green and blue diodes of the OLED of Comparative Example 1, while the red diode of the OLED of Example 1 exhibits significantly longer lifetime than that of the red diode of the OLED of Comparative Example 1.

Figure 3:
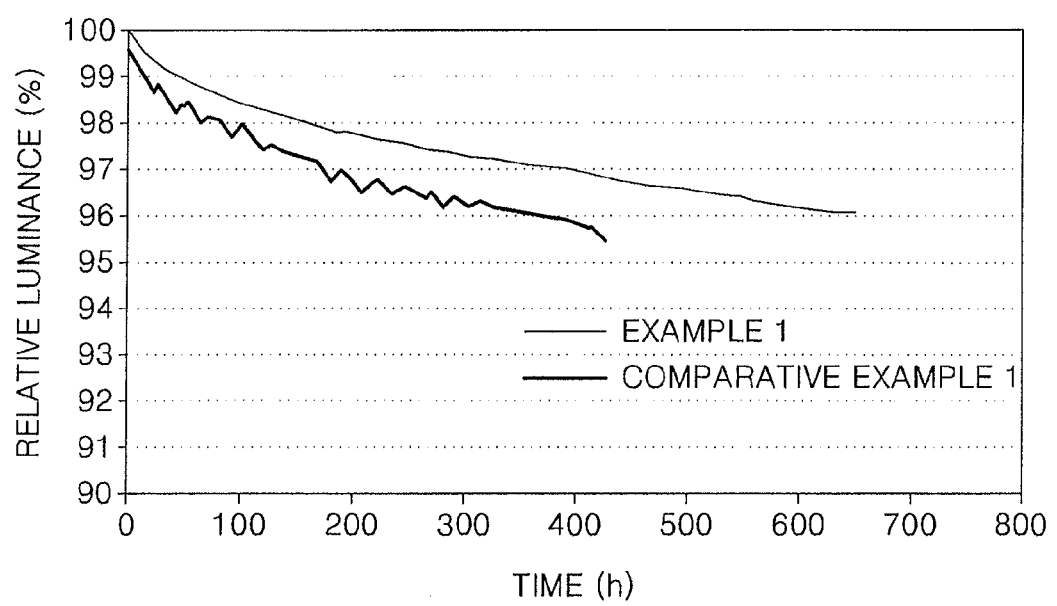
FIG. 3 is a graph showing relative luminance according to time of a red light of the OLEDs manufactured according to Example 1 and Comparative Example 1.

FIG. 3 is a graph showing the lifetime of each of the OLEDs manufactured according to Example 1 and Comparative Example 1. The lifetime is measured based on the relative luminance of an OLED according to usage hours. Relative luminance is an index indicating the lifetime of an OLED, and is represented by a ratio of luminance at each hour to the initial luminance.

Referring to FIG. 3, the OLED of Example 1 exhibits a relative luminance of about 96% even though it is used continuously for 600 hours. In other words, the OLED of Example 1 exhibits luminance that is reduced by less than about 5% after 600 hours over the initial luminance. Meanwhile, the OLED of Comparative Example 1 exhibits a relative luminance of about 95% when it is used continuously for 400 hours. In other words, the OLED of Comparative Example 1 exhibits luminance that is reduced by 5% or greater after 400 hours over the initial luminance. From these results, it is confirmed that the OLED of Example 1 exhibits a small reduction in red emission luminance according to time, and enhanced lifetime.

As described above, according to embodiments of the present invention, an OLED with high image quality and long lifetime may be provided, and a flat display device including the OLED may have improved performance.

While the present invention has been illustrated and described with reference to certain exemplary embodiments, it will be understood by those of ordinary skill in the art that various changes and modifications to the described embodiments may be made without departing from the spirit and scope of the present invention as defined by the following claims.

What is claimed is:

1. An organic light-emitting diode comprising a first sub-pixel, a second sub-pixel and a third sub-pixel of different colors, the organic light-emitting diode comprising:

a substrate;

a first electrode on the substrate;

a second electrode on the first electrode and facing the first electrode;

an organic emission layer between the first electrode and the second electrode, the organic emission layer comprising a first organic emission layer in the first sub-pixel, a second organic emission layer in the second sub-pixel, and a third organic emission layer as a common layer in the first, second and third sub-pixels, a hole transport layer between the first electrode and the organic emission layer;

a hole injection layer between the first electrode and the hole transport layer;

an intermediate layer between the hole transport layer and the hole injection layer;

a first optical thickness auxiliary layer between the first organic emission layer and the third organic emission layer in the first sub-pixel and comprising a first hole transporting compound and a cyano group-containing compound;

and a second optical thickness auxiliary layer comprising a second hole transporting compound between the third organic emission layer and the hole transport layer in the first sub-pixel, and between the second organic emission layer and the hole transport layer in the second sub-pixel;

wherein the cyano group-containing compound comprises at least one compound represented by Formulae 1 through 20:

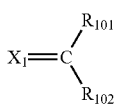

Formula 1

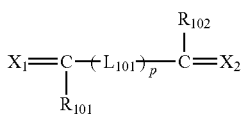

Formula 2

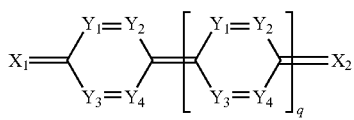

Formula 3

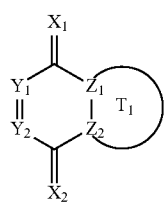

Formula 4

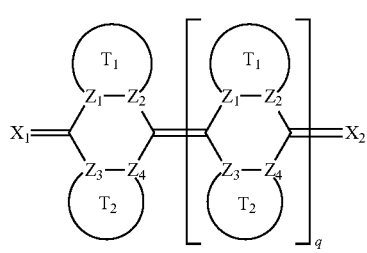

Formula 5

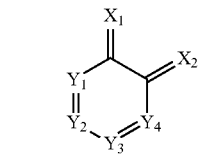

Formula 6

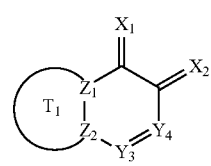

Formula 7

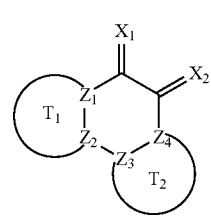

Formula 8

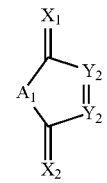

Formula 9

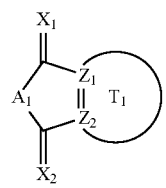

Formula 10

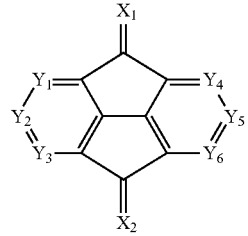

Formula 11

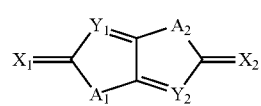

Formula 12

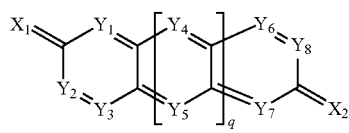

Formula 13

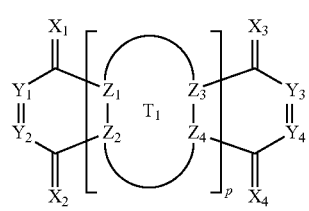

Formula 14

-continued

Formula 15
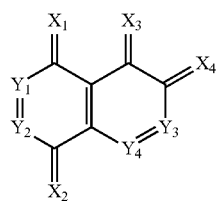

Formula 16
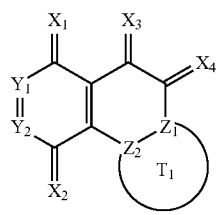

Formula 17
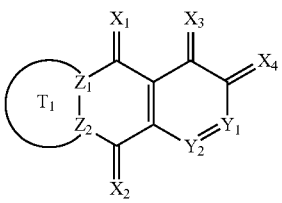

Formula 18
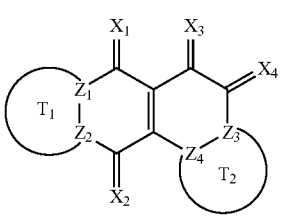

Formula 19
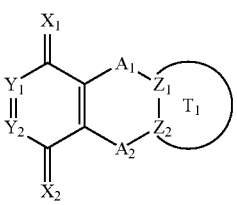

Formula 20
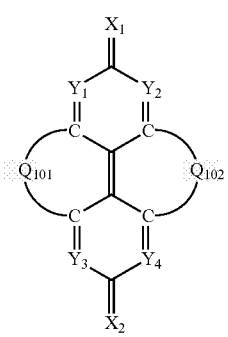

wherein:
each of $X_1$, $X_2$ $X_3$, and $X_4$ is independently selected from the group consisting of

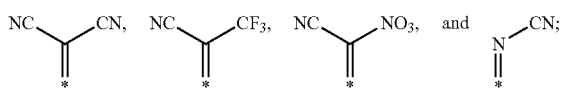

each of $Y_1$ through $Y_8$ is independently N or $CR_{103}$;
each of $Z_1$, $Z_2$, $Z_3$, and $Z_4$ is independently CH or N;
each of $A_1$ and $A_2$ is independently O, S, $NR_{104}$, or $C(R_{105})(R_{106})$;
$L_{101}$ is a substituted or unsubstituted $C_1$-$C_{30}$ alkylene group, or a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group;
each of $Q_{101}$ and $Q_{102}$ is independently a substituted or unsubstituted $C_1$-$C_{30}$ alkylene group or a substituted or unsubstituted $C_2$-$C_{30}$ alkenylene group;
each of $T_1$ and $T_2$ is independently a substituted or unsubstituted $C_5$-$C_{30}$ aromatic ring system or a substituted or unsubstituted $C_3$-$C_{30}$ heteroaromatic ring system;
each of $R_{101}$, $R_{102}$, $R_{103}$, $R_{104}$, $R_{105}$, and $R_{106}$ is independently selected from the group consisting of a hydrogen atom, a deuterium atom, a halogen atom, a hydroxyl group, a cyano group, a nitro group, a carboxyl group,

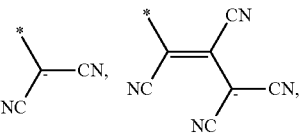 [SMILES: *[C-](C#N)C#N ; */C(C#N)=C(\C#N)[C-](C#N)C#N]

a substituted or unsubstituted $C_1$-$C_{30}$ alkyl group a substituted or unsubstituted $C_2$-$C_{30}$ alkenyl group, a substituted or unsubstituted $C_2$-$C_{30}$ alkenyl group, a substituted or unsubstituted $C_l$-$C_{30}$ alkoxy group, and $N(R_{107})(R_{108})$;
each of $R_{107}$ and $R_{108}$ is independently a hydrogen atom a deuterium atom a halogen atom, a hydroxyl group, a cyano group, an amino group, a nitro group, a carboxyl group a substituted or unsubstituted $C_1$-$C_{30}$ alkyl group, a substituted or unsubstituted $C_5$-$C_{30}$ aryl group or a substituted or unsubstituted $C_3$-$C_{30}$ heteroayl group;
p is an integer of 1 to 10; and
q is an integer of 0 to 10.

2. The organic light-emitting diode of claim 1, wherein the third organic emission layer emits blue visible rays.

3. The organic light-emitting diode of claim 1, wherein each of $X_1$, $X_2$, $X_3$, and $X_4$ is independently

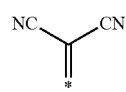

or

4. The organic light-emitting diode of claim 1, wherein $L_{101}$ is a substituted or unsubstituted thiophenylene group, or a substituted or unsubstituted benzothiophenylene group.

5. The organic light-emitting diode of claim 1, wherein each of $T_1$ and $T_2$ is independently a substituted or unsubstituted benzene, a substituted or unsubstituted naphthalene, a substituted or unsubstituted anthracene, a substituted or unsubstituted thiophene, a substituted or unsubstituted thiadiazole, or a substituted or unsubstituted oxadiazole.

6. The organic light-emitting diode of claim 1, wherein $R_{103}$ is a hydrogen atom, a halogen atom, a cyano group, a substituted or unsubstituted $C_1$-$C_{10}$ alkyl group, a substituted or unsubstituted $C_1$-$C_{30}$ alkoxy group, or $N(R_{107})(R_{108})$, wherein each of $R_{107}$ and $R_{108}$ is independently a hydrogen atom, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted methylphenyl group, a substituted or unsubstituted biphenyl group, a substituted or unsubstituted naphthyl group, or a substituted or unsubstituted methylnaphthyl group.

7. The organic light-emitting diode of claim 1, wherein the cyano group-containing compound comprises at least one compound represented by Formulae 1A through 20B:

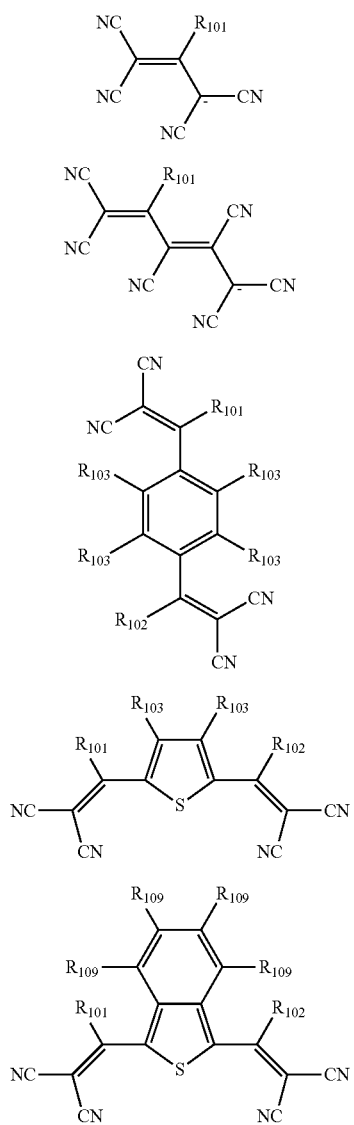

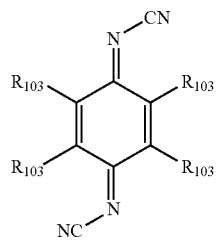

Formula 3A

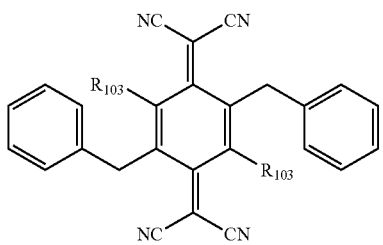

Formula 3B

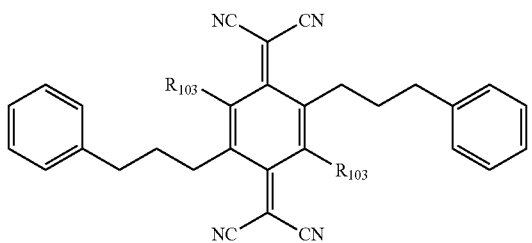

Formula 3C

Formula 3D

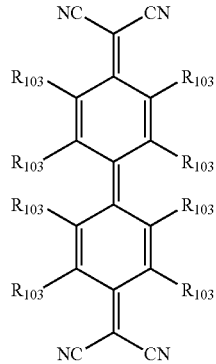

Formula 4A

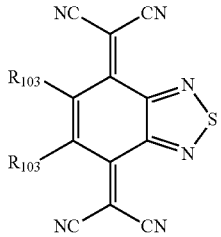

Formula 4B

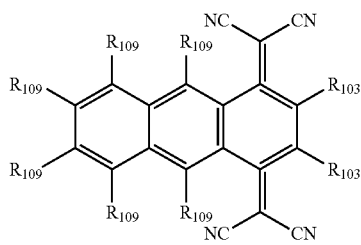

Formula 5A
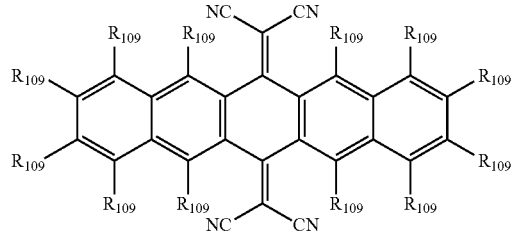
Formula 5B
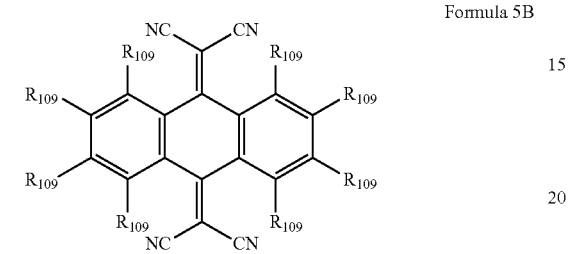
Formula 5C
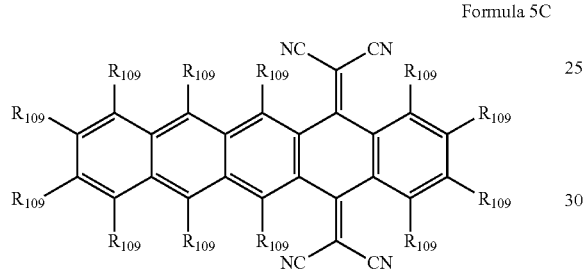
Formula 5D
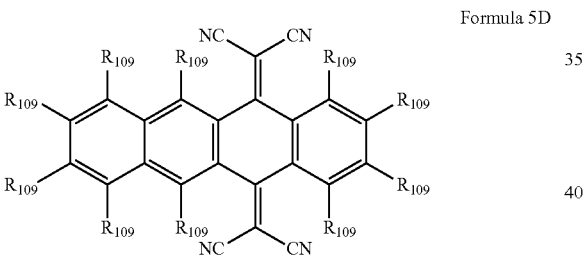
Formula 5E
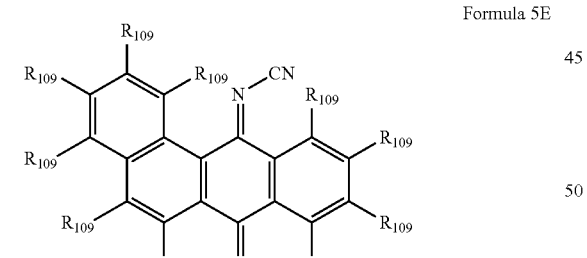
Formula 5F
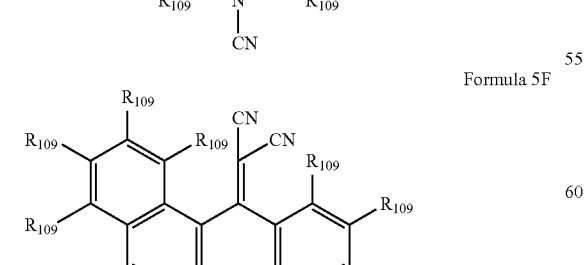
Formula 5G
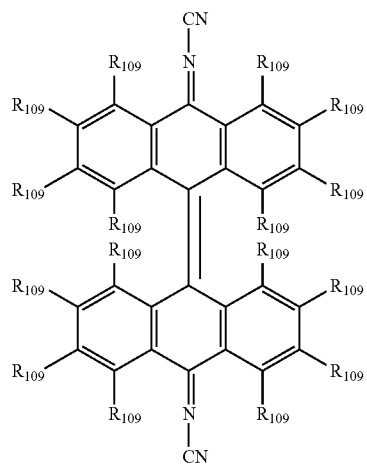
Formula 5H
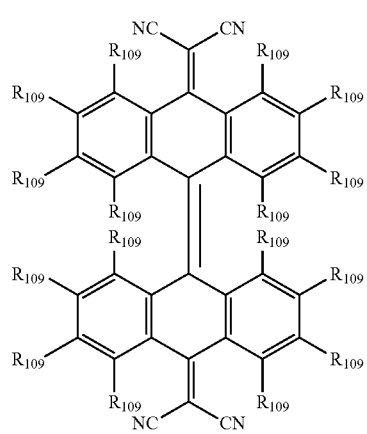
Formula 5I
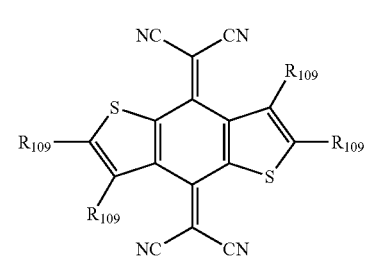
Formula 5J
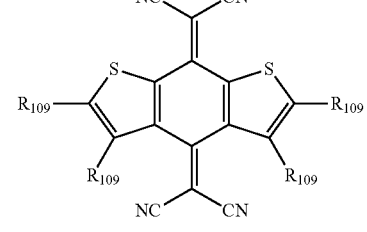
Formula 5K
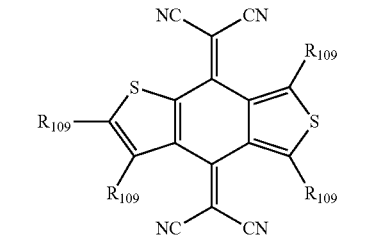

51
-continued

Formula 5L
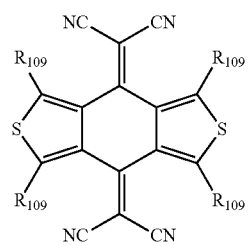

Formula 5M
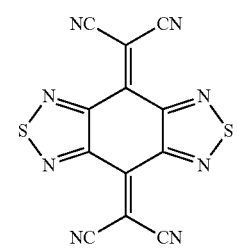

Formula 9A
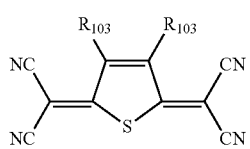

Formula 10A
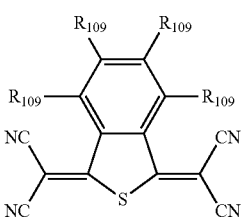

Formula 11A
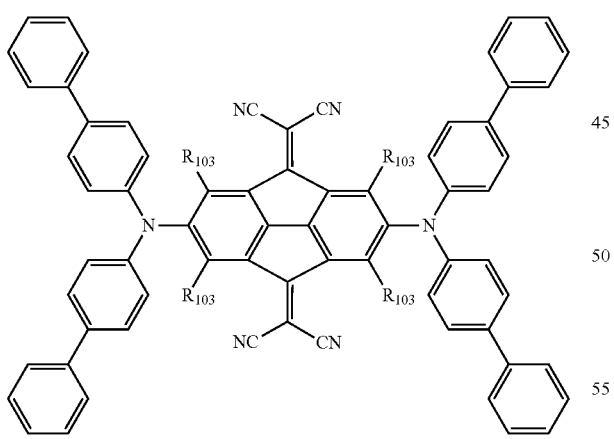

Formula 12A
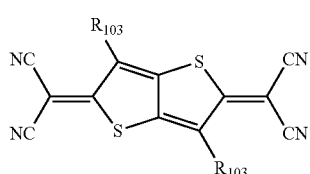

52
-continued

Formula 12B
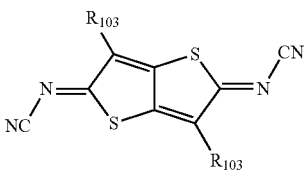

Formula 19A
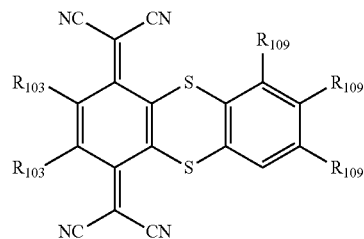

Formula 20A
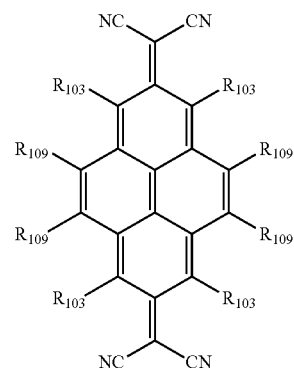

Formula 20B
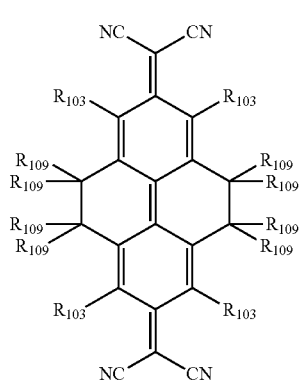

wherein each of $R_{101}$, $R_{102}$, $R_{103}$ and $R_{109}$ is independently a hydrogen atom, a fluorine atom, a cyano group, a substituted or unsubstituted methyl group, a substituted or unsubstituted ethyl group, a substituted or unsubstituted propyl group, a substituted or unsubstituted butyl group, a substituted or unsubstituted ethenyl group, a substituted or unsubstituted methoxy group, a substituted or unsubstituted ethoxy group, or a substituted or unsubstituted propoxy group.

8. The organic light-emitting diode of claim 1, wherein the first hole transporting compound comprises at least one compound represented by Formulae 101 and 102:

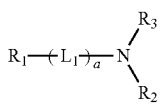

Formula 101

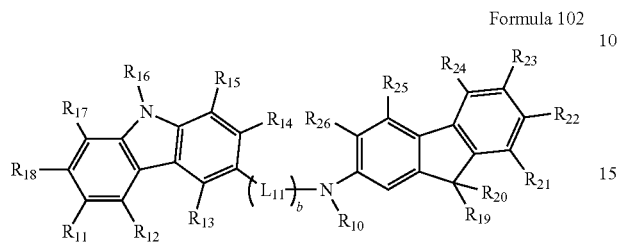

Formula 102 wherein:

$R_{10}$ is —$(Ar_1)_n$—$Ar_2$;

$R_{11}$ is —$(Ar_{11})_m$—$Ar_{12}$;

each of $L_1$, $L_{11}$, $Ar_1$ and $Ar_{11}$ is independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, or —$N(Q_1)$-;

each of $R_1$ through $R_3$, $R_{12}$ through $R_{26}$, $Ar_2$, $Ar_{12}$, and $Q_1$ is independently a hydrogen atom, a deuterium atom, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_3$-$C_{30}$ heteroaryl group, or a group represented by —$N(Q_2)(Q_3)$;

each of $Q_2$ and $Q_3$ is independently a hydrogen atom, a deuterium atom, a halogen atom, a hydroxyl group, a cyano group, an amino group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $O_3$—$C_{30}$ cycloalkyl group, a substituted or unsubstituted $C_3$-$C_{30}$ cycloalkenyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, or a substituted or unsubstituted $C_3$-$C_{30}$ heteroaryl group;

each of a, b, m, and n is independently an integer of 0 to 10;

wherein the $Ar_1$ groups in —$(Ar_1)_n$— are the same as or different from each other, the $Ar_{11}$ groups in —$(Ar_{11})_m$— are the same as or different from each other, the $L_1$ groups in -$(L_1)_a$- are the same as or different from each other, and the $L_{11}$ groups in -$(L_{11})_b$- are the same as or different from each other.

9. The organic light-emitting diode of claim 1, wherein the first hole transporting compound comprises at least one of Compounds 101 through 137:

Compound 101

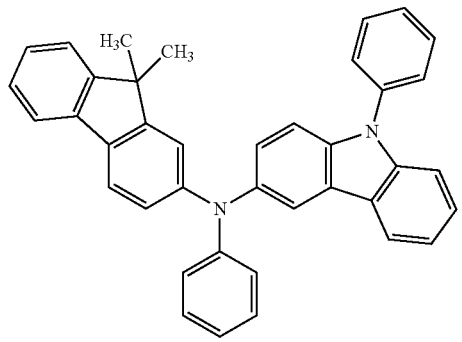

Compound 102

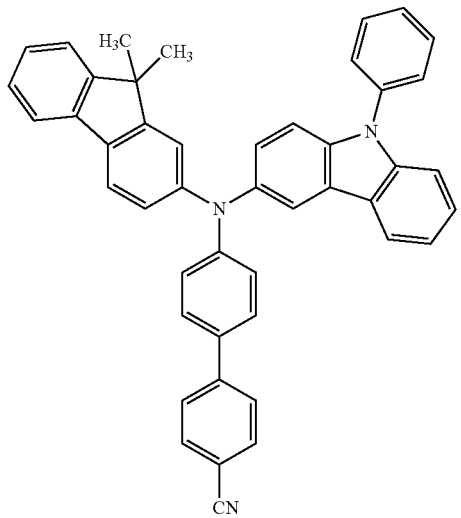

-continued
Compound 103
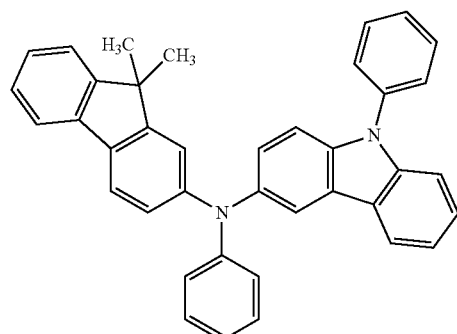
Compound 104
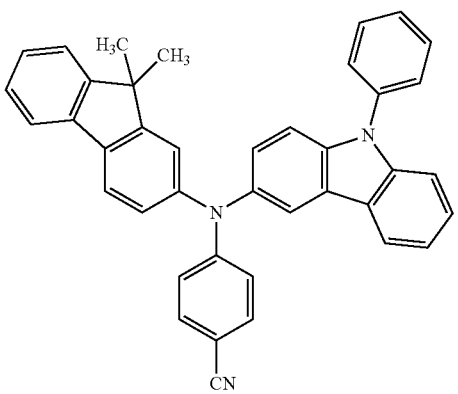
Compound 105
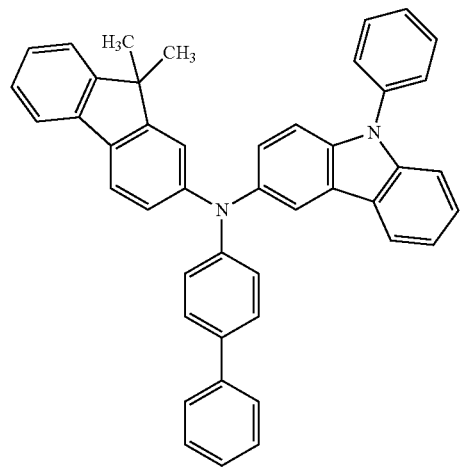
Compound 106
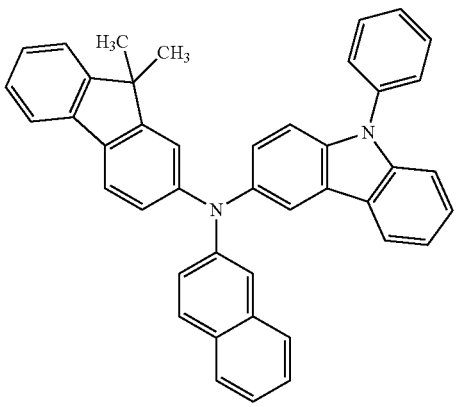
Compound 107
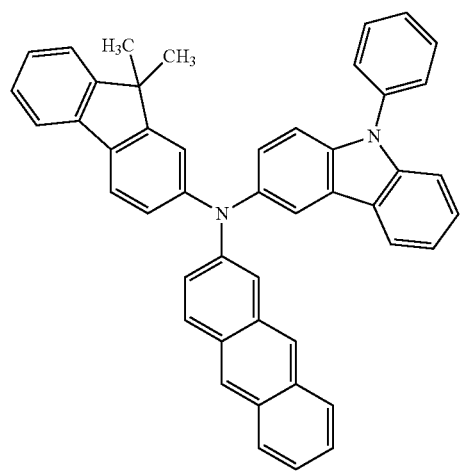
Compound 108
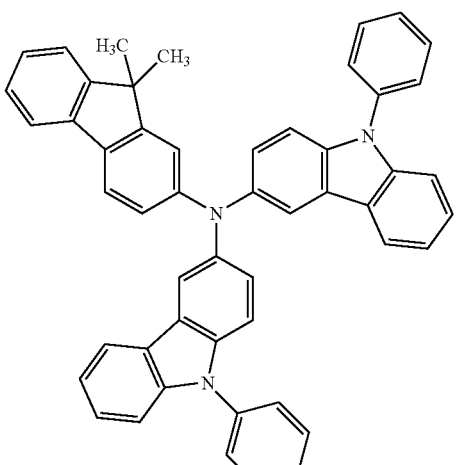

-continued
Compound 109
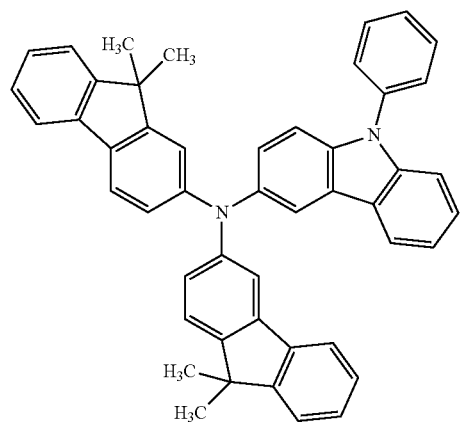
Compound 110
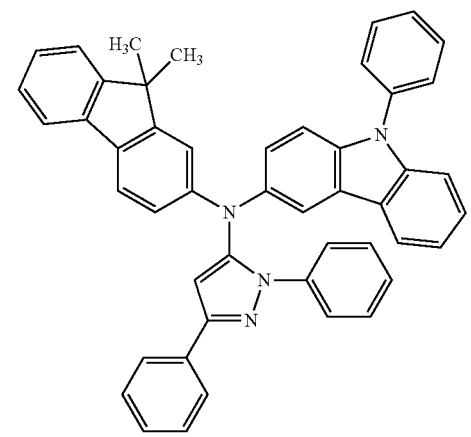
Compound 111
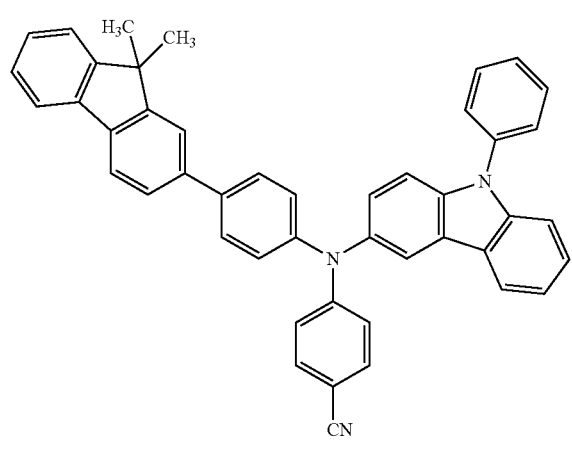
Compound 112
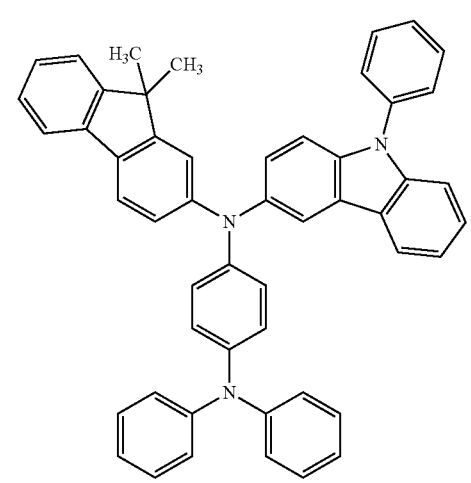
Compound 113
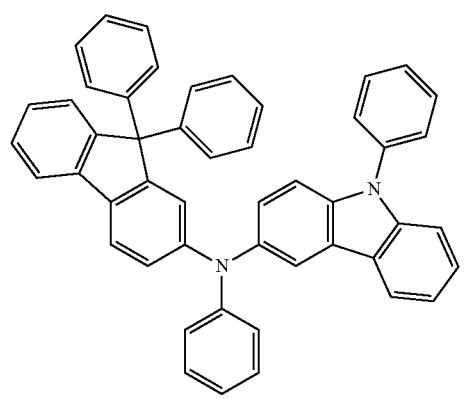
Compound 114
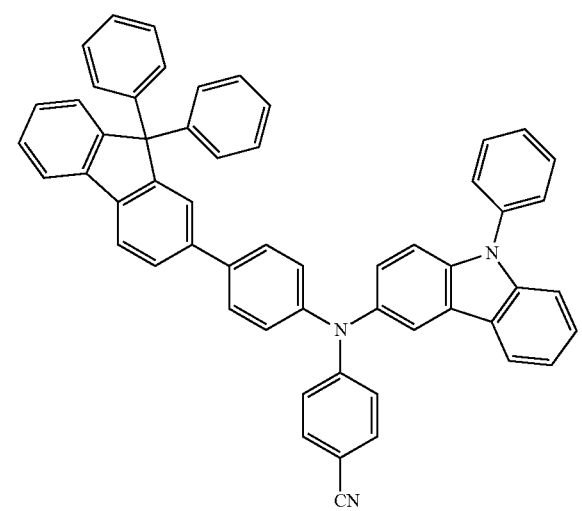

-continued
Compound 115
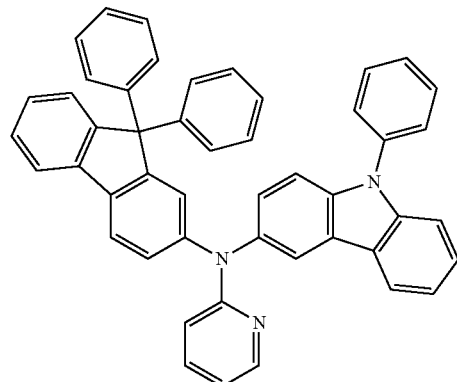
Compound 116
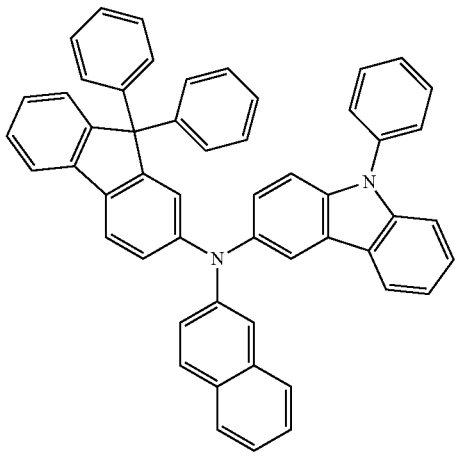
Compound 117
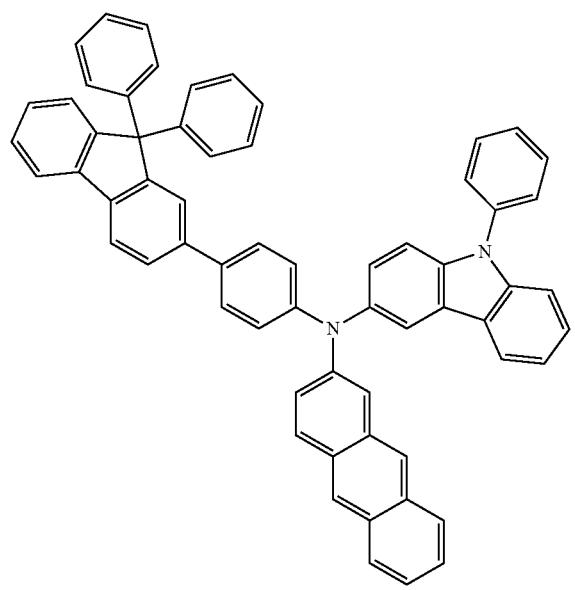
Compound 118
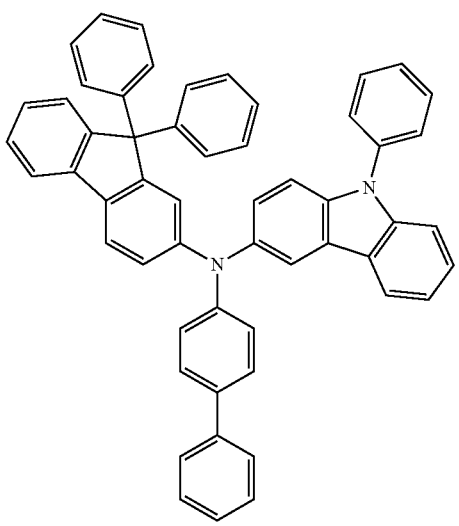
Compound 119
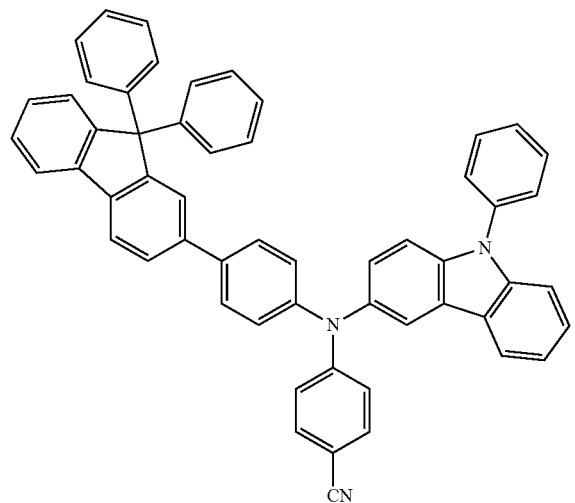
Compound 120
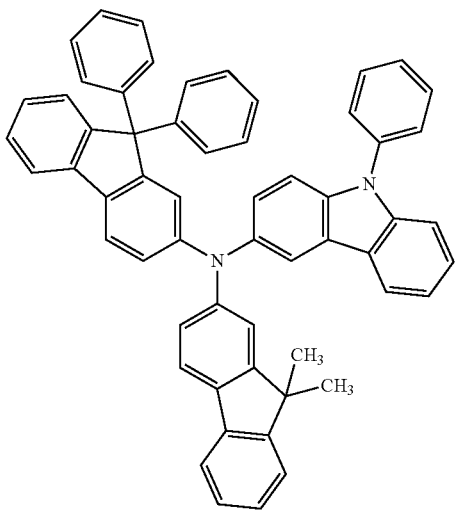

-continued
Compound 121
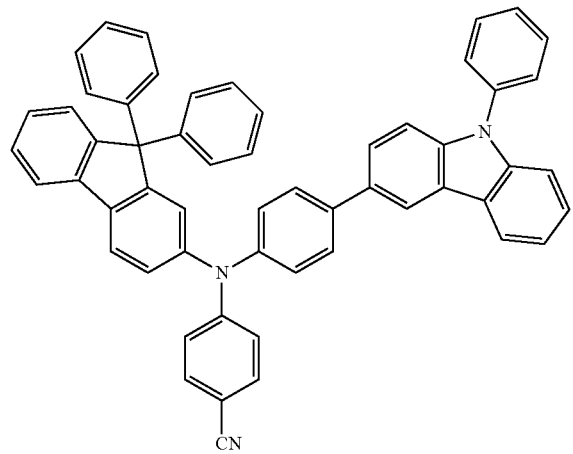
Compound 122
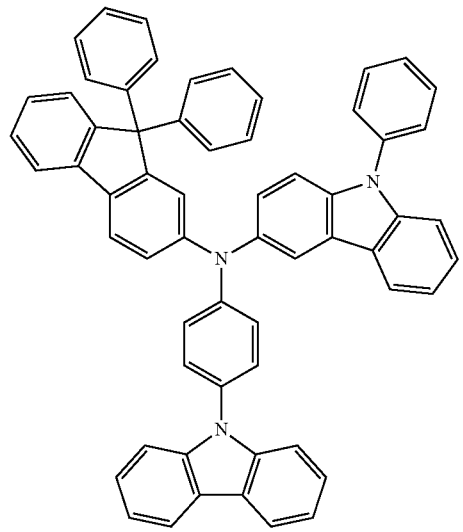
Compound 123
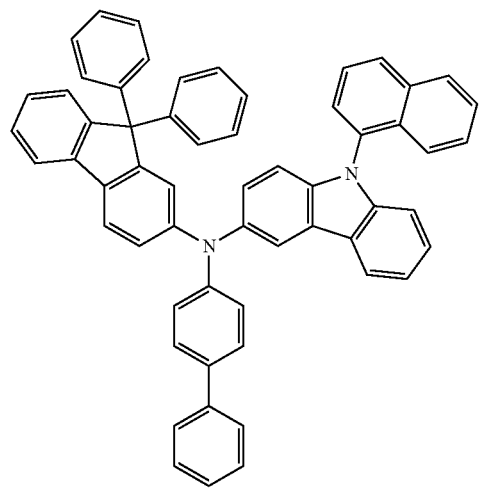
Compound 124
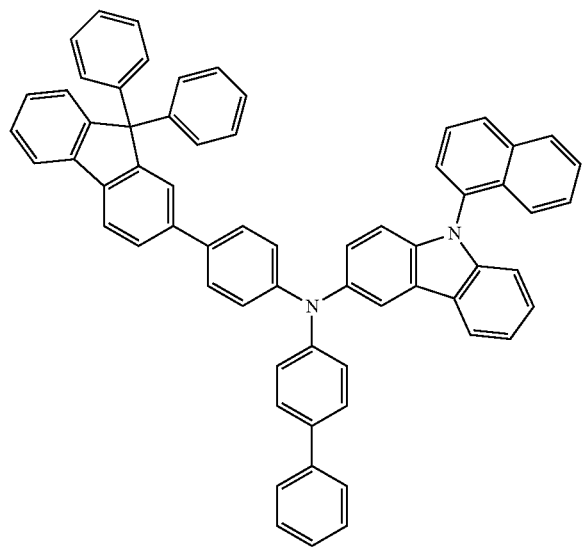
Compound 125
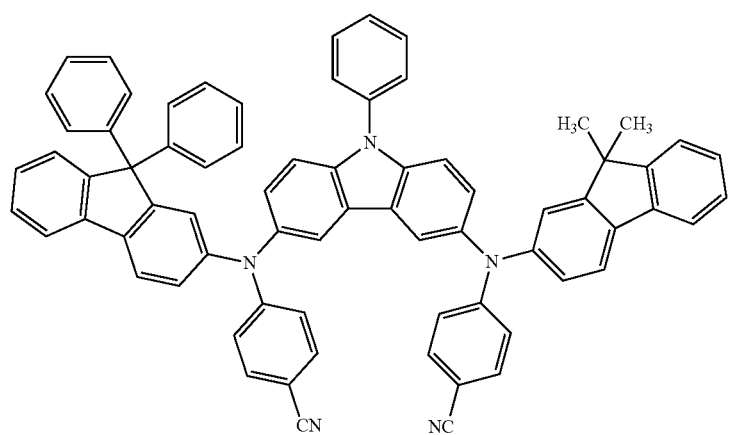

-continued
Compound 126
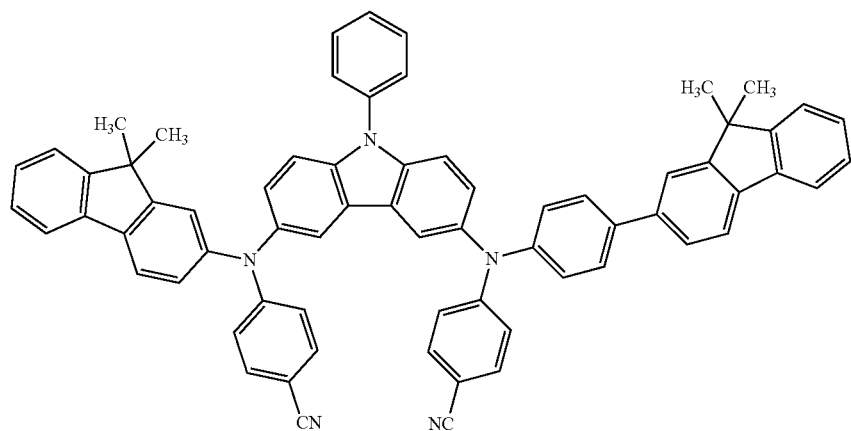
Compound 127
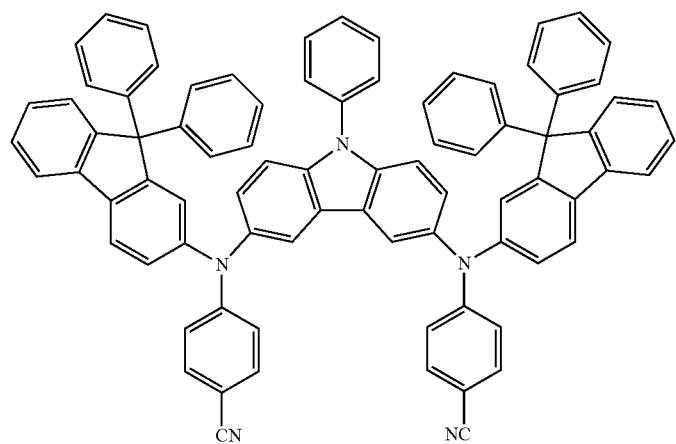
Compound 128
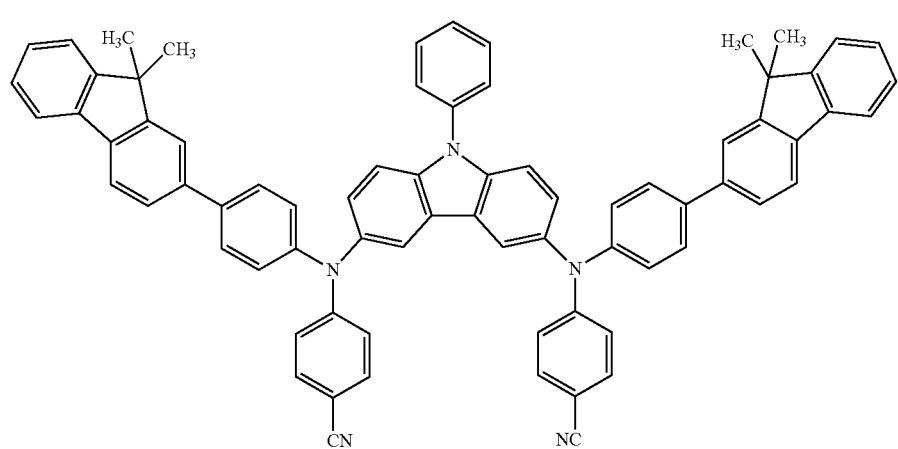

-continued
Compound 129
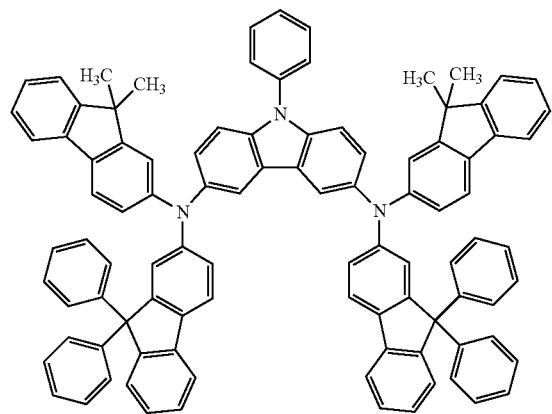
Compound 130
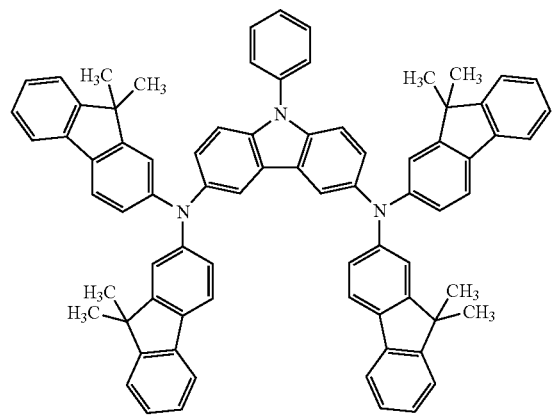
Compound 131
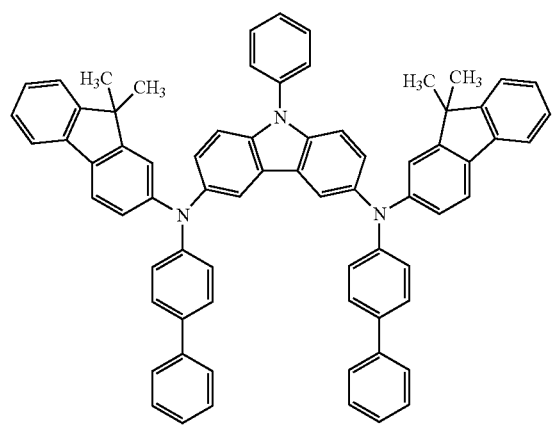
Compound 132
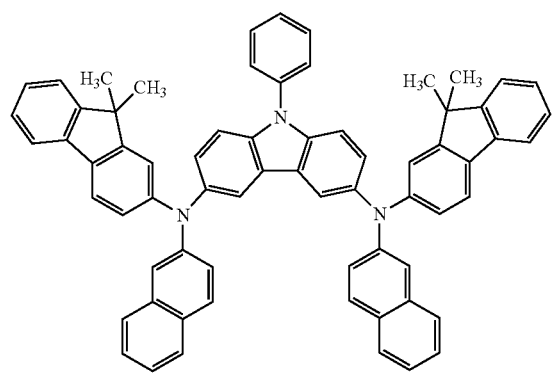
Compound 133
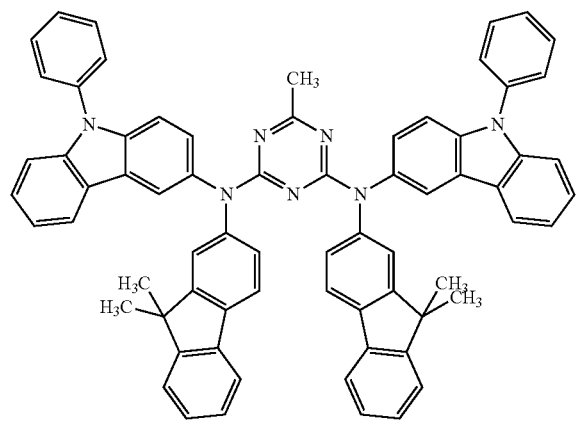
Compound 134
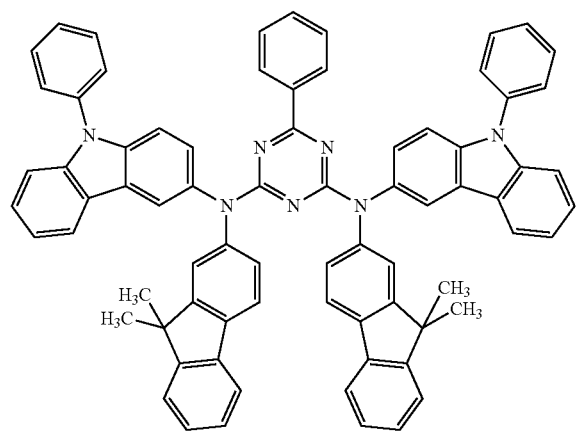

-continued

Compound 135

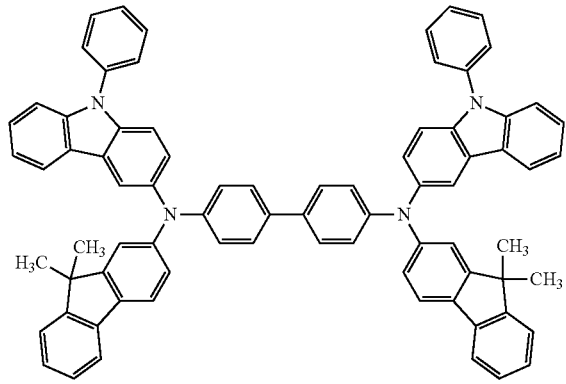

Compound 136

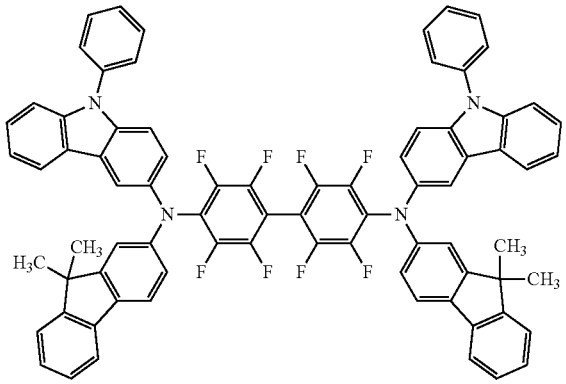

Compound 137

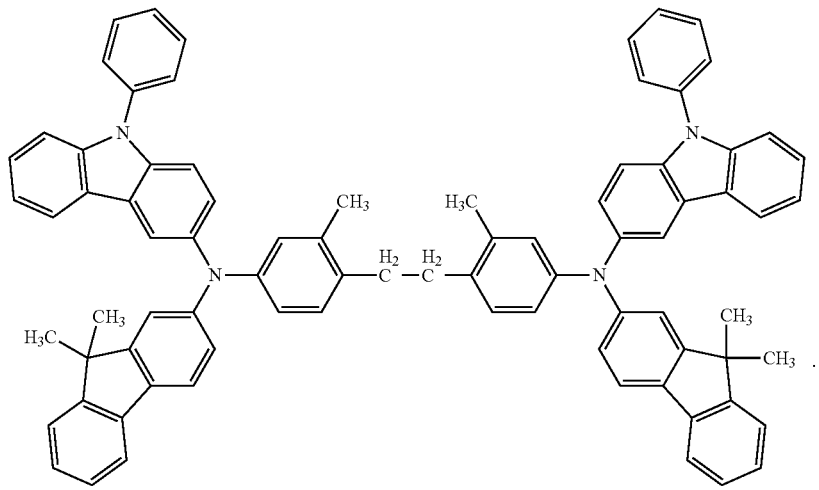

10. The organic light-emitting diode of claim 1, wherein an amount of the cyano group-containing compound in the first optical thickness auxiliary layer is about 0.1 to about 1.0 part by weight based on 100 parts by weight of the first optical thickness auxiliary layer.

11. The organic light-emitting diode of claim 1, wherein the first optical thickness auxiliary layer contacts the first organic emission layer and the third organic emission layer.

12. The organic light-emitting diode of claim 1, wherein the first optical thickness auxiliary layer has a thickness of about 100 Å to about 800 Å.

13. The organic light-emitting diode of claim 1, wherein the second hole transporting compound is the same as the first hole transporting compound.

14. The organic light-emitting diode of claim 1, wherein the second optical thickness auxiliary layer contacts the hole transport layer.

15. The organic light-emitting diode of claim 1, wherein the second optical thickness auxiliary layer has a thickness of about 100 Å to about 800 Å.

16. The organic light-emitting diode of claim 1, wherein the third organic emission layer has a thickness of about 50 Å to about 500 Å.

17. The organic light-emitting diode of claim 1, wherein the intermediate layer comprises at least one selected from the group consisting of hexa-azatriphenylene hexacarbonitrile (HAT-CN), 7,7,8,8-tetracyanoquinonedimethane (TCNQ), tetrafluorotetracyanoquinodimethane (F4-TCNQ), $MoO_3$, $V_2O_5$, $WO_3$, $SnO_2$, ZnO, $MnO_2$, $CoO_2$, $TiO_2$, and fullerene ($C_{60}$).

18. The organic light-emitting diode of claim 1, wherein the intermediate layer has a thickness of about 10 Å to about 80 Å.

19. A flat display device comprising:
    a transistor comprising:
        a source electrode,
        a drain electrode,
        a gate electrode,
        an active layer, and
        the organic light-emitting diode according to claim 1,
    wherein one of the source electrode and the drain electrode is electrically connected to the first electrode of the organic light-emitting diode.

* * * * *